US009654232B2

(12) United States Patent
Manku

(10) Patent No.: US 9,654,232 B2
(45) Date of Patent: May 16, 2017

(54) RADIO FREQUENCY CAMERA SYSTEM

(71) Applicant: Cognitive Systems Corp., Waterloo (CA)

(72) Inventor: Tajinder Manku, Waterloo (CA)

(73) Assignee: Cognitive Systems Corp., Waterloo, Ontario (CA)

( * ) Notice: Subject to any disclaimer, the term of this patent is extended or adjusted under 35 U.S.C. 154(b) by 0 days.

(21) Appl. No.: 14/795,671

(22) Filed: Jul. 9, 2015

(65) Prior Publication Data

US 2017/0013207 A1 Jan. 12, 2017

(51) Int. Cl.

*G01S 13/89* (2006.01)
*H04B 17/00* (2015.01)
*H04B 17/309* (2015.01)
*G08B 13/24* (2006.01)
*G01S 13/56* (2006.01)

(52) U.S. Cl.

CPC .............. *H04B 17/00* (2013.01); *G01S 13/56* (2013.01); *G08B 13/2491* (2013.01); *H04B 17/309* (2015.01)

(58) Field of Classification Search

CPC .... G08B 13/2491; G01S 13/56; H04B 17/309
USPC ...................................................... 342/27, 28
See application file for complete search history.

(56) References Cited

U.S. PATENT DOCUMENTS 5,049,858 A * 9/1991 Price .................. G08B 13/2491 340/552
6,499,006 B1 * 12/2002 Rappaport ........... H04W 16/20 703/20
7,409,116 B1 8/2008 Mackie et al.
7,460,837 B2 * 12/2008 Diener .................. H04B 17/23 455/39
7,746,266 B2 * 6/2010 Zoughi .................. G01S 7/025 342/179
7,916,066 B1 * 3/2011 Osterweil ............ A61B 5/1117 340/573.1
8,060,339 B2 * 11/2011 Ammar .................. G01S 7/411 342/22
8,138,918 B2 * 3/2012 Habib ............... G08B 13/2491 340/286.02
8,497,797 B2 * 7/2013 Lee ...................... G01S 13/888 342/179

(Continued)

OTHER PUBLICATIONS

Canadian Intellectual Property Office; International Search Report and Written Opinion issued in PCT Application No. PCT/CA2015/000604 on Mar. 15, 2016, 9 pages; Gatineau, Quebec; CA.

*Primary Examiner* — Marcus Windrich
(74) *Attorney, Agent, or Firm* — Henry Patent Law Firm PLLC

(57) ABSTRACT

In some aspects, a radio-frequency (RF) camera system includes a sensor assembly and a data processing system. The sensor assembly includes sensors supported at respective sensor locations. Each sensor is supported at one of the sensor locations and configured to detect RF signals from a field of view defined by the sensor assembly. Each sensor is configured to identify parameters of the RF signals detected by the sensor. The data processing system is configured to receive the parameters identified by the sensors and generate a graphical representation of the field of view based on the parameters.

29 Claims, 13 Drawing Sheets

150
160
Cloud Network
140
WiFi Basestation
154
RF Sensor 110
110
110
105
M
N
115
Data Processing System
Δy
Δx
104
User Interface
125

(56) References Cited

U.S. PATENT DOCUMENTS

| | | | | |
|---|---|---|---|---|
| 8,502,729 | B2 * | 8/2013 | Leach, Jr. | G01S 13/0209 340/552 |
| 8,525,725 | B2 * | 9/2013 | Libby | G01S 5/02 342/118 |
| 9,014,021 | B2 * | 4/2015 | Ponnuswamy | H04W 24/06 370/252 |
| 9,143,413 | B1 | 9/2015 | Manku et al. | |
| 9,143,968 | B1 | 9/2015 | Manku et al. | |
| 2006/0083205 | A1 * | 4/2006 | Buddhikot | H04W 16/14 370/338 |
| 2008/0076450 | A1 | 3/2008 | Nanda et al. | |
| 2008/0125108 | A1 | 5/2008 | Kuo et al. | |
| 2008/0165046 | A1 * | 7/2008 | Fullerton | G01S 7/003 342/21 |
| 2011/0243020 | A1 * | 10/2011 | Ponnuswamy | H04L 41/22 370/252 |
| 2011/0254724 | A1 * | 10/2011 | Ricci | G01S 7/023 342/28 |
| 2011/0267221 | A1 | 11/2011 | Brundick et al. | |
| 2011/0291918 | A1 | 12/2011 | Surber et al. | |
| 2012/0146788 | A1 * | 6/2012 | Wilson | G08B 13/187 340/539.23 |
| 2012/0262327 | A1 * | 10/2012 | Hester | H05B 37/0227 342/27 |
| 2015/0123672 | A1 * | 5/2015 | Ao | G01R 31/001 324/512 |

* cited by examiner

RADIO FREQUENCY CAMERA SYSTEM

BACKGROUND

This specification relates to a radio frequency (RF) camera system.

Radio frequency (RF) spectrum is a limited and valuable resource. Governmental agencies and regulatory authorities typically control allocation and use of the spectrum, and the rights to use portions of the spectrum are sold or licensed to wireless service providers and other types of public and private entities. The wireless service providers use the spectrum allocated to them to provide wireless services to end users, for example, in the frequency bands for wireless communication standards.

SUMMARY

In a general aspect, a radio frequency (RF) camera system detects and processes RF signals.

In some aspects, a radio frequency (RF) camera system includes a sensor assembly and a data processing system. The sensor assembly includes sensors supported at respective sensor locations. Each sensor is supported at one of the sensor locations and configured to detect RF signals from a field of view defined by the sensor assembly; each sensor is configured to process the RF signals detected by the sensor to identify parameters of the RF signals. The data processing system is configured to receive the parameters identified by the sensors and generate a graphical representation of the field of view based on the parameters.

In some aspects, a method of generating an image from RF signals includes detecting, by operation of sensors supported at respective sensor locations in a sensor assembly, RF signals from a field of view; identifying parameters of the RF signals by processing the RF signals at the sensors that detected the respective RF signals; and generating, by operation of a data processing system, a graphical representation of the field of view based on the parameters identified by the sensors In some aspects, a method includes receiving, at a computing system, parameters of RF signals detected by sensors in a sensor assembly. The sensors are supported at respective locations in the sensor assembly and define a field of view. The parameters are identified by processing each of the RF signals at the respective sensor that detected the RF signal. The method further includes generating, by operation of the computing system, a graphical representation of the field of view based on the parameters.

The details of one or more implementations are set forth in the accompanying drawings and the description below. Other features, objects, and advantages will be apparent from the description and drawings, and from the claims.

DESCRIPTION OF DRAWINGS

Like reference symbols in the various drawings indicate like elements.

DETAILED DESCRIPTION

Figure 1A:
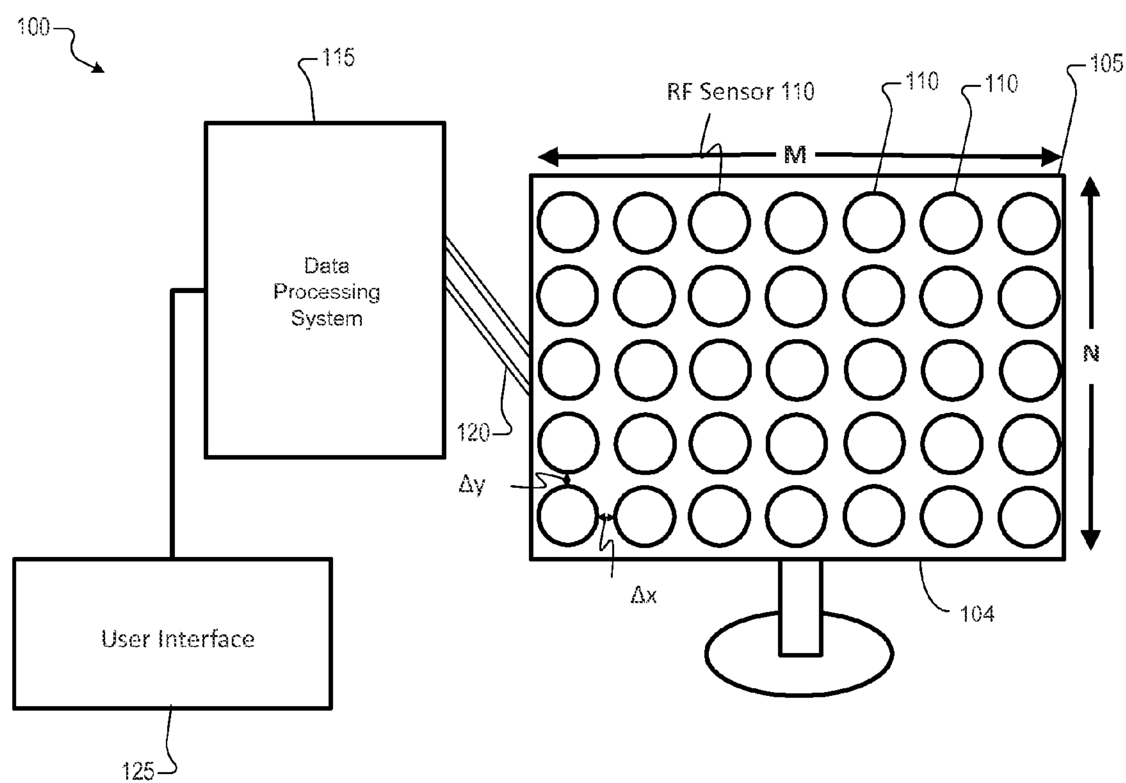
FIG. 1A is a block diagram showing an example radio frequency (RF) camera system.

In some aspects of what is described here, a camera system detects wireless electromagnetic signals and generates visual presentations of the signals. The wireless electromagnetic signals can include, for example, WiFi signals, cellular network signals, television broadcasting signals, and signals generated by other types of systems. In some implementations, the signals detected by the camera system are radio frequency (RF) signals. The RF signals, invisible to human eyes, can occupy the limited and valuable resource of the RF spectrum. An RF camera system can provide a visual representation of the RF signals based on amplitude, phase, or other parameters of the RF signals. In some instances, a visual representation of RF signals can provide intuitive and user-friendly illustration of utilization, allocation, and other information of the RF spectrum in a region of interest.

In some implementations, an RF camera system can include one or more sensor assemblies and a data processing system. In some examples, the sensor assembly includes a number of wireless sensor devices (also referred to as "RF sensors," "sensors," or "spectrum inspection (SI) boxes"). The one or more sensor assemblies or the wireless sensor devices within a sensor assembly can be distributed over various locations over a geographic region. The wireless sensor devices can monitor and analyze the RF spectrum at the respective locations, detect RF signals from a field of view defined by the sensor assembly, and transmit information (e.g., parameters of the RF signals) to the data processing system. The data processing system can serve as a central back-end system that aggregates, compiles, and analyzes information transmitted from the wireless sensor devices. The data processing system can receive the RF spectrum measurements identified by the wireless sensor devices and generate a graphical representation of the field of view based on the parameters. As an example, the graphical representation of the field of view can include an image, and each pixel in the image may correspond to the RF parameters from an individual wireless sensor device or multiple wireless sensor devices. As another example, the graphical representation of the field of view can include a heat map where different colors represent the different values of the RF parameters from an individual wireless sensor device or multiple wireless sensor devices.

The wireless sensor devices can inspect the RF spectrum by detecting the RF signals and identifying parameters of the RF signals. In some cases, each wireless sensor device can look at the RF signal at a particular frequency (f) over a bandwidth (BW). For example, the wireless sensor device can look at the RF signals as complex variables and identify not only the amplitude and power, but also the phase of the RF signals. Compared to the amplitude or the absolute value of power, the phase information can be significantly more susceptible to changes in the surroundings. The wireless sensor devices can process the signal relatively fast and can identify the phase information of the RF signals. In some instances, the wireless sensor devices can detect changes in the RF signals, which may indicate, for example, movement of an object in the RF signals' path, movement of an RF source, etc.

In some implementations, each wireless sensor device is configured to identify and analyze data encoded in the RF signal, for example, by demodulating and decoding the wireless signals transmitted according to various wireless communication standards. For example, the wireless sensor devices may be configured to monitor and analyze wireless signals that are formatted according to a particular communication standard or protocol, for example, 2G standards such as Global System for Mobile (GSM) and Enhanced Data rates for GSM Evolution (EDGE) or EGPRS; 3G standards such as Code division multiple access (CDMA), Universal Mobile Telecommunications System (UMTS), and Time Division Synchronous Code Division Multiple Access (TD-SCDMA); 4G standards such as Long-Term Evolution (LTE) and LTE-Advanced (LTE-A); wireless local area network (WLAN) or WiFi standards such as IEEE 802.11, Bluetooth, near-field communications (NFC), millimeter communications; or multiple of these or other types of wireless communication standards. In some implementations, other types of wireless communication (e.g., non-standardized signals and communication protocols) are monitored and analyzed.

In some implementations, the wireless sensor devices detect signals exchanged according to a wireless communication network protocol (e.g., a cellular network), although the wireless sensor devices themselves are not part of the cellular network. In some implementations, the wireless sensor devices are capable of extracting all available characteristics, synchronization information, cells and services identifiers, quality measures of RF, and Physical Layers of wireless communication standards.

In some implementations, the wireless sensor devices monitor and analyze wireless signals over space and time. For example, parameters of the wireless signals can be aggregated from a number of wireless sensor devices that operate concurrently at various locations in a geographic region. The geographic region can be relatively small or large (e.g., having a radius ranging from tens or hundreds of meters to multiple kilometers) and can generally represent any area of interest (e.g., a building, city block, jurisdiction, demographic, industry, etc.). The wireless sensor devices of the RF camera system can be placed such that the field of view defined by the sensor assembly covers the area of interest. The parameters of the wireless signals detected by the wireless sensor devices can be used to generate a visual representation of the RF signals over the geographic region of interest, for example, to facilitate a realistic and comprehensive analysis of spectral usage and provide an understanding of the utilization and quality of RF signals and other resources in the geographic region.

In some implementations, the visual representation can provide a more intuitive and comprehensive understanding of the usage, signal quality, or other attributes of the RF spectrum. As such, targeted schemes can be used to improve the utilization and signal quality of wireless-spectrum and other resources. In some instances, based on utilization and quality of the frequency bands that they own or operate on, spectrum rights owners and licensees or wireless service providers can design, modify, or otherwise manage their own spectrum usage. For example, given a graphical image that tracks the amplitude or power of RF signals in certain geographic locations, wireless service providers may identify the existence of coverage holes in the geographic locations and determine whether to add base stations or modify a cell configuration (e.g., adjusting a frequency reuse scheme) to improve the coverage in the geographic locations.

In some implementations, the RF camera system and the individual wireless sensor devices can perform various types of analyses in the frequency domain, the time domain, or both. For example, each individual wireless sensor device may analyze the wireless spectrum in the frequency domain, in the time domain, or both. In some cases, the wireless sensor devices are configured to determine bandwidth, power spectral density, or other frequency attributes based on detected signals. In some cases, the wireless sensor devices are configured to perform demodulation and other operations to extract content from the wireless signals in the time domain such as, for example, signaling information included the wireless signals (e.g., preambles, synchronization information, channel condition indicator, SSID/MAC address of a WiFi network).

In some examples, an RF camera system generates the visual representation of the field of view based on parameters of the RF signals from the wireless sensor devices. For example, the visual representation can be an image (e.g., a color image, a gray-scale image, etc.). The visual representation can be provided to users via a user interface, stored in a database (e.g., for analysis or archival purposes), transmitted to subscribers or other entities (e.g., governmental agencies or regulatory authorities, standards-development organizations, spectrum rights owners and licensees, wireless service providers, etc.), or output in another manner. In some examples, the visual representation can include frequency-domain information, time-domain information, spatial-domain information, or a combination of these and other knowledge gained from analyzing the wireless signals detected by the wireless sensor devices. In some implementations, the visual representation can include parameters from all wireless sensor devices in the RF camera system. In some implementations, the visual representation can include parameters from a subsect of the wireless sensor devices (e.g., one of multiple sensor assemblies) in the RF camera system.

In some cases, wireless sensor devices monitor wireless signals at their respective locations passively, for example, by "listening" or "watching" for RF signals over a broad range of frequencies and processing the RF signals that they detect. There may be times when no RF signals are detected, and a wireless sensor device may process RF signals (e.g., from time to time or continuously) as they are detected in the local environment of the device.

In some examples, the RF camera system can include a large number (e.g., tens, hundreds, or thousands) of wireless sensor devices at distinct locations over one or more sensor domains to concurrently monitor wireless signals at each distinct location. Accordingly, RF signals at various locations can be inspected at the same time or during overlapping time periods, which gives rise to a more accurate and more comprehensive inspection of wireless signals over the geographic region.

In some implementations, the large number of wireless sensor devices can be divided into multiple subsets. For example, the RF camera system can include multiple sensor assemblies. Each sensor assembly may include a respective number of wireless sensor devices that are arranged in a relative small region while the multiple sensor assemblies are distributed in a relatively larger geographic region.

In some implementations, each sensor assembly can include a support structure that the wireless sensor devices are attached to or mounted on. In some implementations, each of the wireless sensor devices, the support structure, or both can be configured to rotate, tilt, or move in various directions so that the wireless sensor devices can be directed towards a particular orientation for monitoring RF signals. The locations (including orientations) of the wireless sensor devices can collectively define the field of view of the RF camera system, which is the range of space that the RF camera system can "see." In some implementations, movable and adjustable features of the wireless sensor devices and the support structure allow for a configurable field of view of the RF camera system and, thus, enable a user or a control system to modify the area of interest for the RF signal monitoring.

In some cases, the wireless sensor devices can be implemented as relatively low-cost, compact, and lightweight devices. In some instances, the wireless sensor devices operate with low power consumption (e.g., around 0.1 to 0.2 Watts or less on average). In some examples, an individual wireless sensor device can be smaller than a typical personal computer or laptop computer and can operate in a variety of environments. In some cases, a wireless sensor device can be manufactured for less than $100, although the actual cost will vary.

Unlike a base station that is often large, expensive (e.g., a cellular base station can cost in the range of $100,000 to $1,000,000 or more), and needs large power (e.g., on the order of 10 Watts to 100 Watts or more) to transmit signals over a relatively large region, the small size and portability of the wireless sensor devices can be leveraged by the RF camera system to expand the applicability and enhance the flexibility of the RF camera system. In some instances, wireless sensor devices can be placed at or coupled to a pico/femto cell box of a cellular system, a WiFi access point or base station, a vehicle, a router, a mobile device (e.g., a smartphone, a tablet, etc.), a computer, an Internet of Things (e.g., machine-to-machine (M2M)) module, a cable modem box, a home gear electronic box (e.g., TV, modem, DVD, video game stations, laptops, kitchen gear, printers, lighting, phones, clocks, thermostats, fire detection units, $CO_2$ detection units, etc.), or other places.

In some implementations, a desirable field of view and resolution of the image generated by the RF camera system can be determined, for example, based on the area, population, location, or other factors of a geographic area. For instance, the desired image resolution may be higher in an urban area and lower in a rural area. In some instances, the RF camera system may leverage the relatively low cost and small size of the wireless sensor devices to place a large number of the wireless sensor devices in a sensor domain to provide a higher resolution image of the field view within the region of interest.

In some implementations, a wireless sensor device can perform computations and analyses on the raw data (e.g., the detected RF signals) on the spot, to extract a digest of relevant information (e.g., parameters of the RF signals). In some implementations, instead of transmitting the raw data to the data processing system, the wireless sensor devices transmit the digest extracted from the raw data, which may reduce data traffic, reduce power consumption (which may extend battery life, where applicable), and provide other advantages. In some cases, the raw data can be transmitted to the data processing system, for example, upon request or in other instances.

In some implementations, communication between wireless sensor devices and a data processing system can be based on, for example, internet protocol (IP) transport or another standard data transport protocol, which may provide more efficient data transmission. In general, messages can be transmitted from the wireless sensor devices to the data processing system at any time. For example, the transmission can be triggered by detected usage of the RF spectrum, initiated by a request from the data processing system, sent according to a predetermined schedule or periodic intervals, or otherwise. In some instances, the data processing system can request data from a particular wireless sensor device.

In some examples, the wireless sensor devices can be deployed and controlled from a back-end system. For example, the sensor assembly of an RF camera system may operate without requiring a technician on site to operate the device. In some implementations, a data processing system or another type of central control system can execute control operations, for example, to configure or upgrade the sensor assembly or the individual wireless sensor devices. In some instances, the control system can request configuration information or run internal tests on any particular wireless sensor device.

Figure 1B:
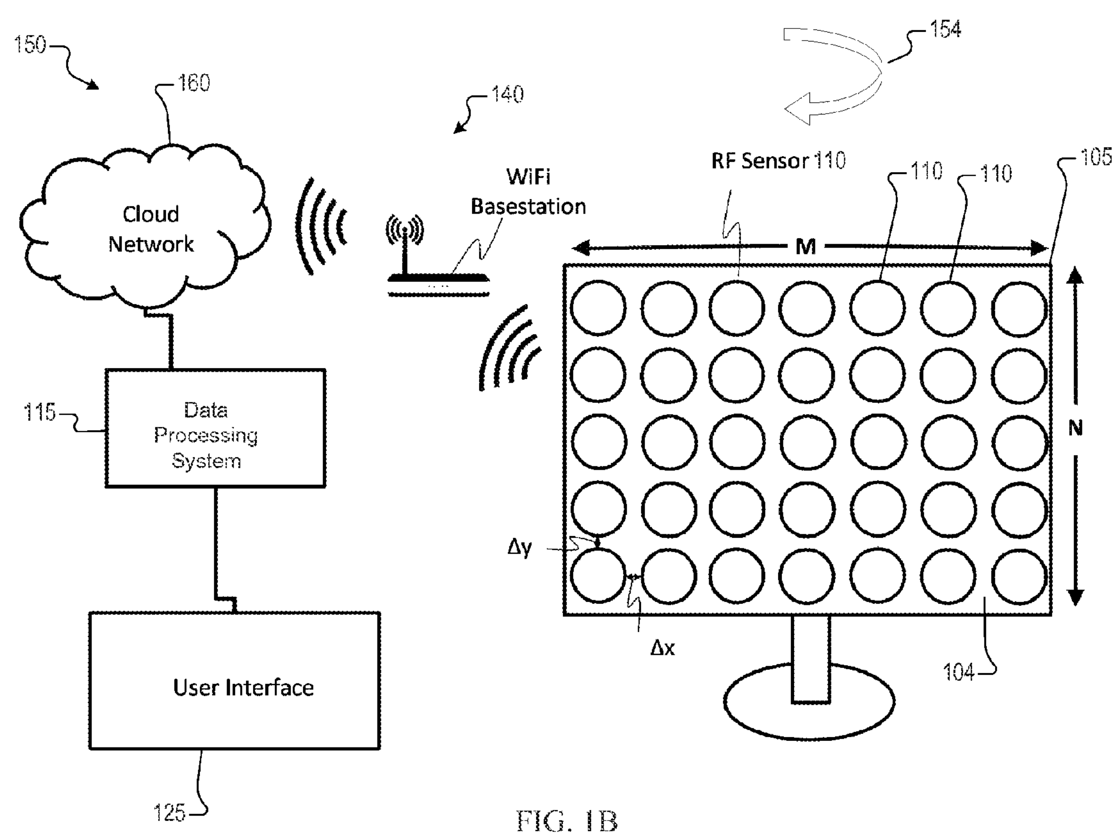
FIG. 1B is a block diagram showing another example RF camera system.

FIG. 1A is a block diagram showing an example RF camera system 100 that can detect wireless signals and generate a graphical representation of a field of view. FIG. 1B is a block diagram showing another example RF camera system 150, which is a variation of the RF camera system 100 of FIG. 1A. The example RF camera system 100 includes a sensor assembly 105, a data processing system 115 (e.g., a central computer), and a user interface 125. The RF camera system 100 can include additional or different components, and the components and features of an RF camera system can be arranged as shown in FIG. 1A or in another manner.

As shown in FIG. 1A, the sensor assembly 105 includes a number of wireless sensor devices 110. The wireless sensor devices 110 can be identical or similar to each other, or the RF camera system 100 can include a variety of different wireless sensor devices 110. In some implementations, the sensor assembly 105 includes a support structure 104 that supports the wireless sensor devices 110 at their respective sensor locations. The locations of wireless sensor devices 110 can form an ordered array (e.g., a square or rectangular array) or a non-ordered array (e.g., random, irregular) in a two-dimensional (2D) or three-dimensional (3D) domain.

For example, FIG. 1A shows that the sensor assembly 105 includes a support structure 104 that supports M by N wireless sensor devices 110. In the example shown, the locations of the wireless sensor devices 110 form an ordered rectangular array and define a planar sensor domain across two spatial dimensions. The wireless sensor devices 110 are separated by a distance $\Delta x$ in the horizontal direction and by a distance $\Delta y$ in the vertical direction. The distances $\Delta x$ and $\Delta y$ can be the same or different between any two adjacent wireless sensor devices 110. The locations of the wireless sensor devices 110 can be fixed, or they can be moved or otherwise adjusted.

In some cases, a wireless sensor device 110 can be installed by one or more operators, for example, by positioning the device 110 on the supporting structure 104 and connecting it to power and data links. In some cases, a wireless sensor device can be secured in place by fasteners (e.g., screws, bolts, latches, adhesive, etc.). In some instances, the wireless sensor devices 110, the sensor assembly 105, and hence the RF camera system 100 can operate in a variety of locations and environments. As an example, some wireless sensor devices 110 and the sensor assembly 105 can be installed in a vehicle (e.g., a car, a bus, a train, a ship, etc.) where the wireless sensor device 110 can monitor and analyze the spectrum while in motion. In other examples, wireless sensor devices 110, the sensor assembly 105, and the RF camera system 100 can be installed on traffic infrastructure, communication infrastructure, power infrastructure, dedicated real property, industrial systems, urban or commercial buildings, residential areas, and other types of locations.

The wireless sensor devices 110, supported at respective sensor locations of the sensor assembly 105, are configured to detect RF signals from a field of view. The field of view of the RF camera system 100 can be defined by the respective locations, the number and pattern of antennas, or other attributes of the wireless sensor devices 110. For example, the field of view of the RF camera system 100 in FIG. 1A includes the region from which the wireless sensor devices 110 detect the RF signals.

In some implementations, the individual wireless sensor devices 110 can tilt, rotate, or otherwise move in one or more directions. In some implementations, the wireless sensor devices 110 can be configured to function as a pan-tilt-zoom camera (PTZ camera) that is capable of local or remote directional and zoom control. In some implementations, the support structure 104 can tilt, rotate, or otherwise move in one or more directions. In some implementations, the antennas and other components of the wireless sensor devices 110 can tilt, rotate, or otherwise move in one or more directions. As such, the field of view of the RF camera system 100 can tilt, rotate, expand, shrink, or otherwise change accordingly. In some implementations, the wireless sensor devices 110, the support structure 104, or both can tilt, rotate, or otherwise move in one or more directions constantly or from time to time. For example, the support structure 104 may rotate along the direction 154 at a constant speed such that the RF camera system 100 can have a panoramic field of view over time. The support structure 104 may rotate or move along another direction and additional or different movements or adjustments of the locations and orientations of the wireless sensor devices 110 and the support structure 104 can be configured, for example, to obtain a different field of view.

Figure 1C:
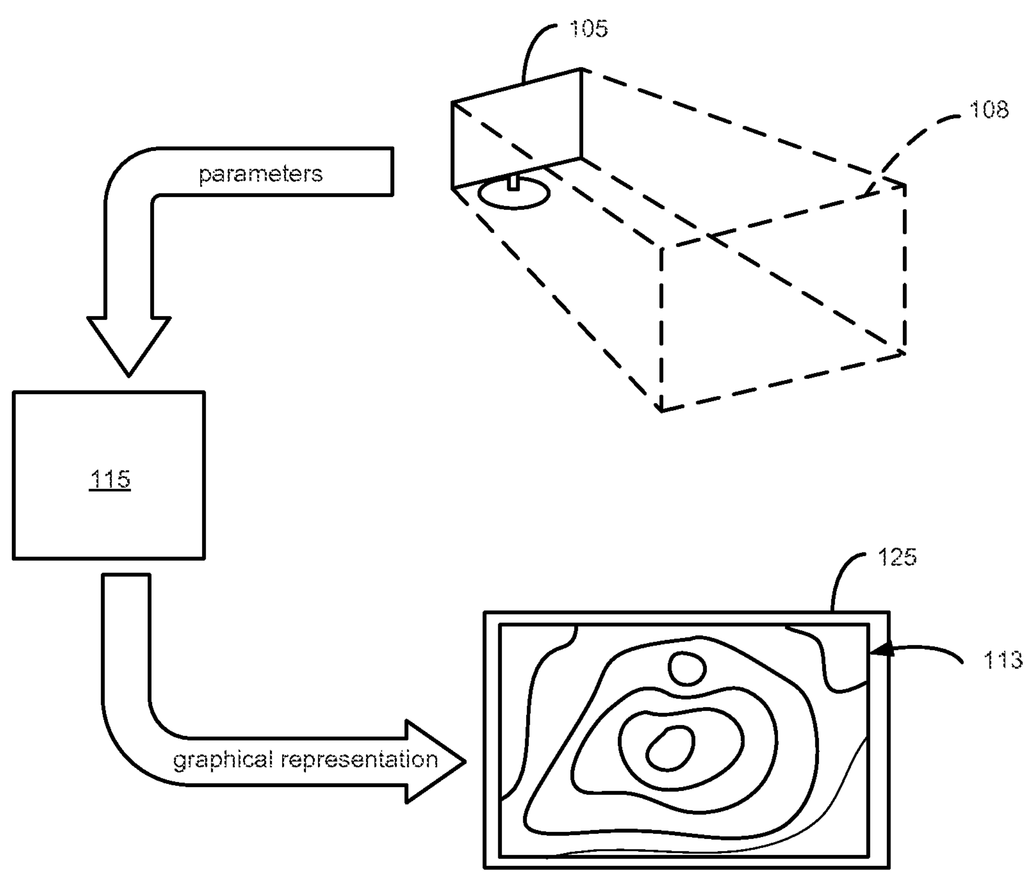
FIG. 1C is a block diagram showing example operations of the RF camera systems of FIG. 1A and FIG. 1B.

FIG. 1C is a block diagram showing example operations of the RF camera systems of FIG. 1A and FIG. 1B. As shown in FIG. 1C, the sensor assembly 105 defines a field of view 108 that extends over a region projected from the sensor domain. The example field of view 108 shown in FIG. 1C has a generally rectangular shape and projects from the planar sensor domain in the direction that is perpendicular to the planar sensor domain. In some instances, the sensor assembly 105 can be adjusted to modify the field of view 108. For instance, the support structure 104, the individual sensor devices 110 or a combination of these and other features can be adjusted (e.g., rotated, translated, etc.) to broaden the field of view, narrow the field of view, reorient the field of view, change the shape of the field of view, or otherwise modify the field of view. The example sensor assemblies 135 and 145 shown in FIGS. 2A, 2B, 3A, and 3B define fields of view having other shapes and projections.

In the example shown in FIG. 1C, the sensor devices in the sensor assembly 105 process the RF signals detected from the field of view, and the RF signal processing identifies parameters (e.g., phase, amplitude, etc.) of the RF signals. The parameters are received by the data processing system 115, and the data processing system 115 generates a graphical representation of the field of view 108 based on the parameters. For instance, the graphical representation can be defined by pixels, vector graphic objects, or a combination of these or other graphic elements. The graphical representation can be provided to the user interface 125, and the user interface 125 can render an image 113 from the graphical representation. In the example shown in FIG. 1C, the image 113 shows spatial variations in the parameters of RF signals detected from the field of view 108. The image 113 can include, for instance, a topological plot, a temperature plot, or another type of image.

In some implementations, the individual sensors in the sensor assembly 105, the data processing system 115, or both can analyze the field of view 108 or perform other types of analysis. For instance, the RF camera system may analyze the RF signals to identify the number of reflections (e.g., scatters or other types of interactions) that the RF signals experience in their path to the sensor assembly 105. The number of reflections or other data may be used to detect objects or media in the field of view or other types of information. In some instances, the RF camera system may detect a time-series of RF signal parameters over time. For example, the camera system may systematically scan or sample the wireless sensor devices 110 in the sensor assembly 105, and record a time-series of data points. The time-series can be used, for example, to generate dynamic graphical representations (e.g., four-dimensional data, video, animation, etc.) of the field of view 108. In some instances, the RF camera system may detect changes in the RF signal parameters over time; the changes and other data may be used to detect movement of objects or media changes in the field of view or other types of information.

Figure 2A:
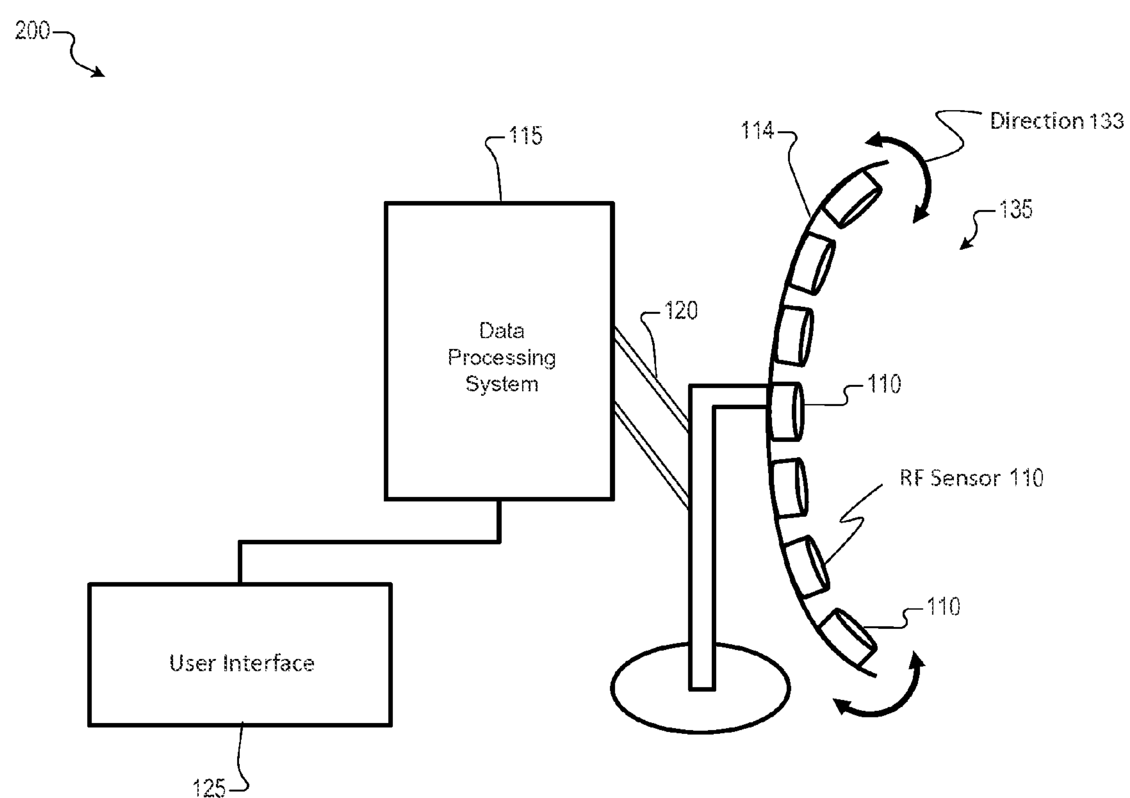
FIG. 2A is a block diagram showing another example RF camera system.
Figure 2B:
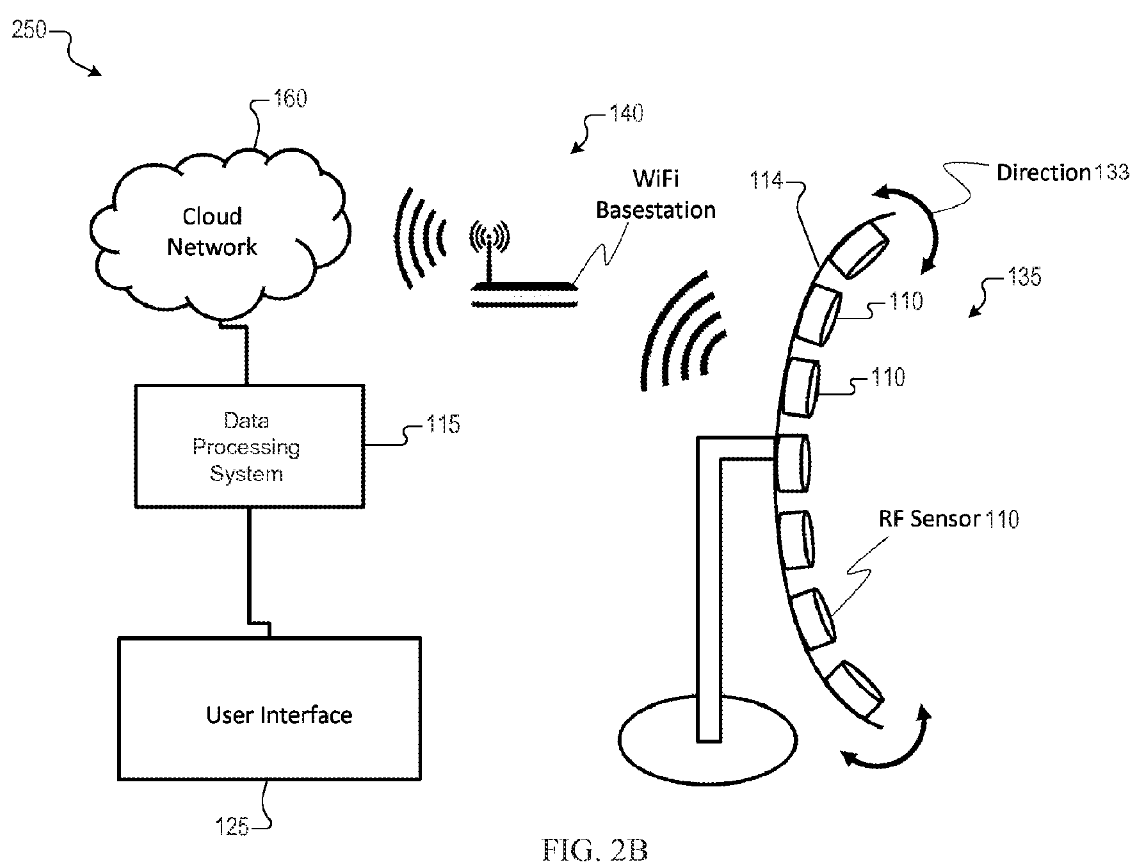
FIG. 2B is a block diagram showing another example RF camera system.

FIG. 2A is a block diagram showing an example RF camera system 200. FIG. 2B is a block diagram showing another example RF camera system 250, which is a variation of the example RF camera system 200 of FIG. 2A. The example RF camera systems 200 and 250 each include a data processing system 115 (e.g., a central computer) and user interface 125 similar to those shown in FIGS. 1A and 1B. The example RF camera systems 200 and 250 each include a sensor assembly 135 that is different from the example sensor assembly 105 in FIGS. 1A and 1B.

As shown in FIGS. 2A and 2B, the sensor assembly 135 includes a number of wireless sensor devices 110 mounted on a support structure 114, and the locations of the wireless sensor devices 110 define a curved sensor domain. In some implementations, a sensor domain can include multiple curves along one or more dimensions. In some implementations, the support structure 114 can move or rotate, for example, along the direction 133. In some implementations, the support structure 114 can rotate along the direction 133 while maintaining the shape and curvature of the curved surface. In some other implementations, the support structure 114 can curl up or flatten out, thus changing the shape and curvature of the curved surface. The support structure 114 can change or move in other directions. As such, the fields of view of the RF camera systems 200 and 250 can change accordingly.

Figure 3A:
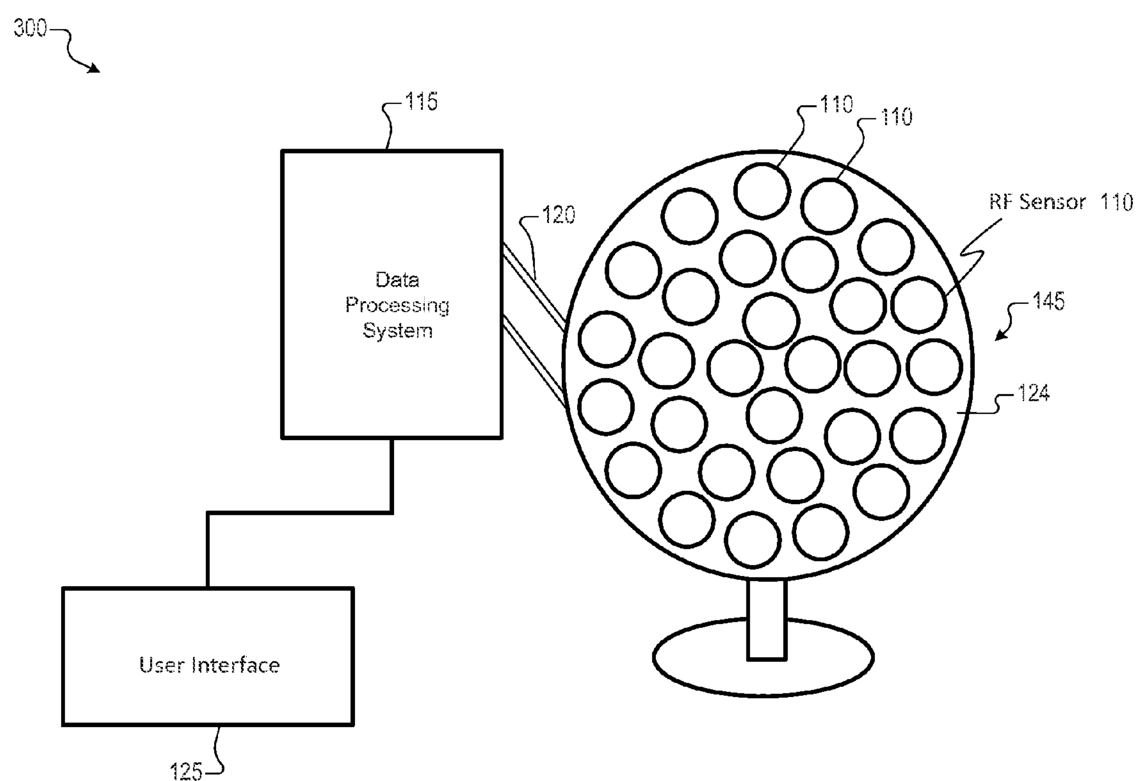
FIG. 3A is a block diagram showing another example RF camera system.
Figure 3B:
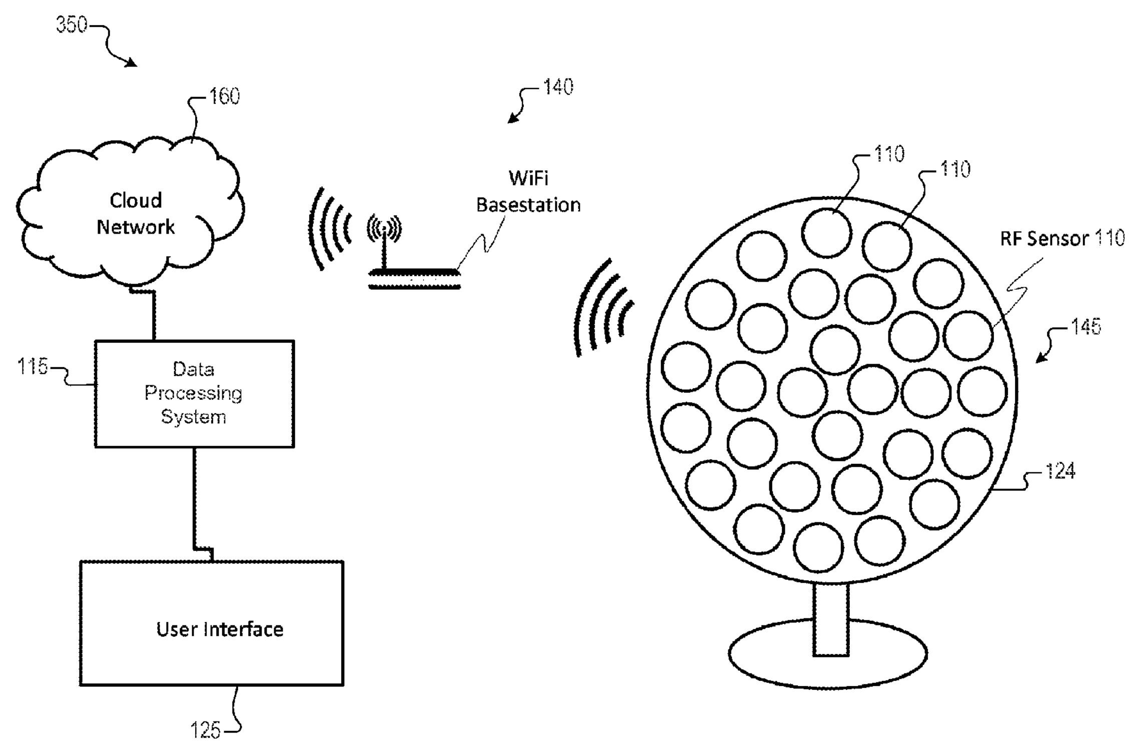
FIG. 3B is a block diagram showing another example RF camera system.

FIG. 3A is a block diagram showing an example RF camera system 300. FIG. 3B is a block diagram showing another example RF camera system 350, which is a variation of the example RF camera system 300 of FIG. 3A. The example RF camera systems 300 and 350 each include a data processing system 115 (e.g., a central computer) and user interface 125 similar to those shown in FIGS. 1A and 1B.

The example RF camera systems 300 and 350 each include a sensor assembly 145 that is different from the example sensor assembly 105 in FIGS. 1A and 1B and the example sensor assembly 135 in FIGS. 2A and 2B.

As shown in FIGS. 3A and 3B, the sensor assembly 145 includes a number of wireless sensor devices 110 mounted on a support structure 124, and the locations of the wireless sensor devices 110 define a sphere in the 3D sensor domain. In some implementations, the sensor devices can define another type of three-dimensional sensor domain, such as, for example, a spheroid, ellipsoid, or other three-dimensional geometry. In some instances, the RF camera systems 300 and 350 can have a panoramic field of view. In some implementations, the wireless sensor devices 110 and the support structure 124 can be configured to move or rotate, providing fine tuning or calibration of the field of view of the RF camera system 300 and 350.

In some implementations, the support structure (e.g., the support structure 104, 114, and 124) may be made of or include RF absorption materials so that only the RF signals originating from the field of view are measured by the wireless sensor devices 110 on the support structure. An RF camera system can include other types of support structures and additional or different numbers and placements of the wireless sensor devices 110. A desired field view of an RF camera system can be obtained, for instance, by choosing, modifying, or otherwise configuring the number, antenna designs, and placement of the wireless sensor devices and the supporting structure of the sensor assembly.

Each of the wireless sensor devices 110 can be configured to detect RF signals from the field of view defined by the sensor assembly and process the RF signals detected by the sensor to identify parameters of the RF signals. The parameter can include, for example, amplitude, phase, and some other physical parameter (e.g., signal power, power spectral density, etc.) or statistics (e.g., mean, median, minimum, maximum, standard deviation, etc.) that are based on amplitude and phase of the RF signals. The wireless sensor devices 110 can be configured to identify the parameters in the frequency domain, the time domain, or both. In some cases, the wireless sensor devices 110 are configured to identify the parameters of RF signals of a particular frequency, bandwidth, communication standard, or other categories. In some cases, the wireless sensor devices 110 are configured to identify other parameters of RF signals, such as, for example, the number of reflections (or "scatterers") in an RF signal's path.

In some implementations, the wireless sensor device 110 can include a chip or chipset that processes the RF signals at the wireless sensor device 110 itself, as opposed to processing at the data processing system 115 or other central computing systems. The wireless sensor device 110 can perform appropriate signal processing to identify the parameter of the RF signals according to the formatting or encoding of the RF signals under the communication protocol or standard. For example, if the RF signals are encoded according to the LTE standard, the wireless sensor device 110 can be configured to demodulate, decode, or otherwise process the detected RF signals and identify the parameters according to the specifications of the LTE standard. In some implementations, the wireless sensor devices 110 can be configured to identify and extract synchronization information, channel quality measurements, or other control or traffic data contained in the RF signals.

In some implementations, each wireless sensor device 110 is time-aligned with the other wireless sensor devices 110. The synchronization among the wireless sensor devices 110 can be established, for example, using a synchronized signal that already exists within the RF spectrum, aligning or calibrating all the clocks provided to each wireless sensor device 110, or other synchronization techniques.

In some implementations, the wireless sensor device 110 can transmit the identified parameters of the RF signals to the data processing system 115, for example, through a shared or central communication link between the sensor assembly (e.g., the sensor assembly 105, 135, or 145) and the data processing system 115. For example, the sensor assembly may collect and aggregate the information identified by its wireless sensor devices 110 and transmit the aggregated information to the data processing system 115 via the central communication link independent of a data network. The central link can be a wireless or a wired communication link (e.g., the wired communication links 120 in FIGS. 1A, 2A, and 3A).

In some implementations, the sensor assembly can be configured to communicate the parameters to a data network (e.g., the Internet, a cloud network, an enterprise network, a private network, etc.), and the data processing system 115 can include a communication interface configured to receive the parameters from the data network. The sensor assembly and the data processing system 115 can communicate through one or more of a wireline, wireless, or hybrid communication networks. For example, FIGS. 1B, 2B, and 3B show that the sensor assemblies 105, 135, and 145 communicate with a cloud network 160 through a WiFi network 140, respectively, and the data processing system 115 is communicably linked to the cloud network 160. The sensor assembly can upload the parameters to data processing system 115 through the cloud network 160, for example, regularly or from time to time. The data processing system 115 can download or otherwise retrieve the parameters through the cloud network 160. Additional or different types of communication techniques (e.g., cellular, Bluetooth, near-field communication, etc.) can be used for communications between the sensor assembly and the data processing system 115.

In some implementations, the wireless sensor devices 110 can be configured to communicate the parameters to the data processing system 115 directly. For example, each of the individual wireless sensor devices 110 can be communicably linked to a data network (e.g., a cloud network) and send parameters directly to the data network through a wireless communication network. The data processing system 115 can receive the parameters through the data network.

The data processing system 115 can be a standalone computing system, a server, a smartphone, or any other module, device, or system that can generate images from data. The data processing system 115 can include a communication interface configured to receive the parameters, for example, from one or more wireless sensor devices 110, a data network, or the sensor assembly 105. In some implementations, the data processing system 115 can be a processing subsystem that is attached to or integrated with the sensor assembly 105.

The data processing system 115 can receive the parameters identified by the wireless sensor devices 110 and generate a graphical representation of the field of view based on the parameters. The graphical representation can be an image of the field of view of the RF camera system. In some implementations, the graphical representation can include a map or other visual representations that illustrate the values and properties of the parameters of the RF signals identified by an individual wireless sensor device 110 or multiple wireless sensor devices 110. For example, the data processing system 115 can be configured to generate the graphical representation of the field of view based on the phases, amplitudes, or other parameters of the RF signals identified by the wireless sensor devices 110. The graphical representation can include, for instance, an image or map showing the phases, amplitude, or power of RF signals in a geographic region within the field of view. In some cases, a bar chart or other graphical module can show the temporal distribution or trends of parameters of the RF signals over time (e.g., showing the peak, average, and valley of the amplitudes of the RF signals during a day, a month, or a year). In some cases, the graphical representation can an image showing the historical data and predictions of the parameters of the RF signals. In some implementations, each wireless sensor device 110 can be configured to monitor RF signals over time and to identify a time-series of parameters, and the data processing system 115 is configured to generate a dynamic graphical representation (e.g., a video, an animation, etc.) of the field of view based on the time-series of parameters. In some instances, the wireless sensor devices 110 can detect movement of objects in the field of view, for example, based on changes in the monitored RF signals.

The user interface 125 can include any device, module, or other software or hardware components that can display or otherwise present information to a user. For example, the user interface 125 can include a display, a screen, a touch screen or other input/output devices. In some implementations, the user interface 125 is attached to or integrated with the data processing system 115. In some implementations, the user interface 125 includes the input/output devices or other user interfaces of a client computer, a tablet, a smartphone, or any other user equipment. In some implementations, the user interface 125 can include a graphic use interface (GUI) through which the graphical representation of the field of view generated by the data processing system 115 can be displayed to a user. As an example, the user interface 125 can include an application, a web browser, or a command line interface (CLI) that processes information and presents the information to a user. In general, a GUI may include a number of user interface (UI) elements, such as interactive fields, pull-down lists, and buttons operable by the user. These and other UI elements may be related to or represent the functions of the RF camera systems (e.g., for zooming in or out the graphical representations of the field of view, adjusting the locations or orientations of the wireless sensor devices 110 or the support structure 104, 114, or 124, etc.).

Figure 4:
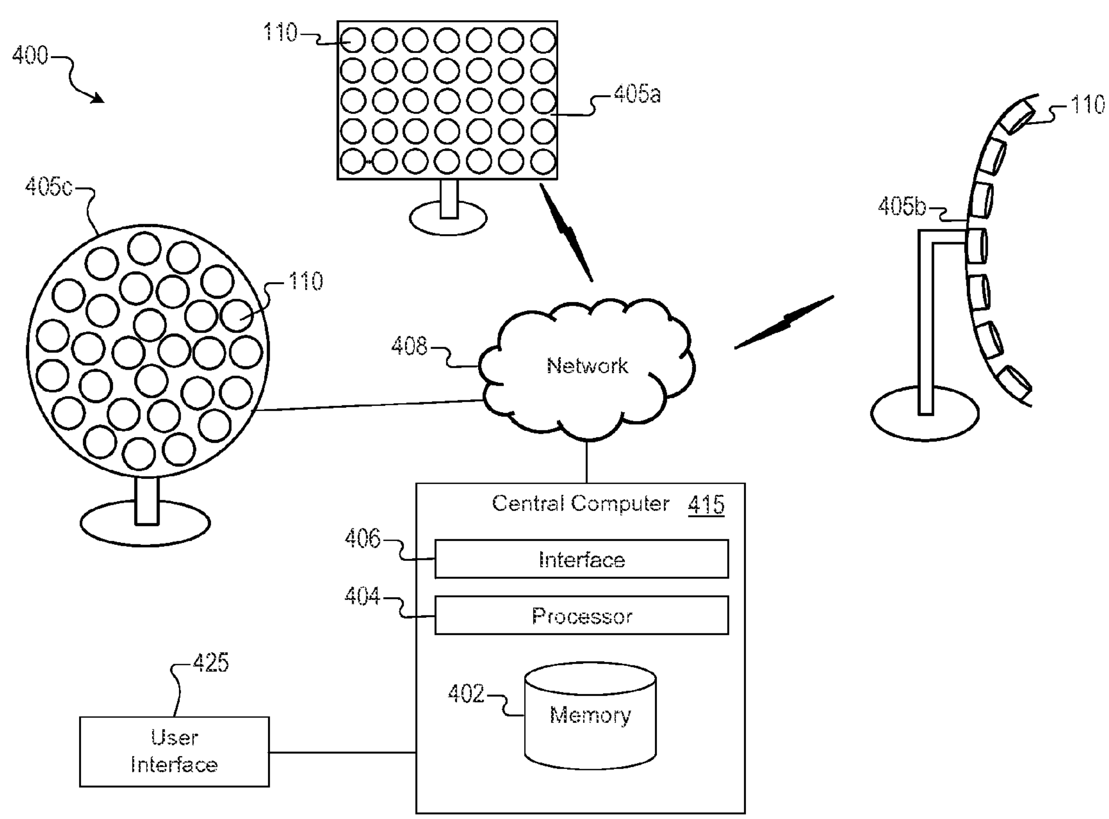
FIG. 4 is block diagram showing an example RF camera system that includes multiple sensor assemblies.

FIG. 4 is a block diagram showing another example RF camera system 400. The example RF camera system 400 includes multiple sensor assemblies 405*a*, 405*b*, and 405*c*, a central computer system 415 and a user interface 425. Each sensor assembly 405*a*, 405*b*, or 405*c* can be configured to communicate with the central computer system 415 via one or more networks 408 or other communication links. The RF camera system 400 can include additional or different components, and the components and features of the RF camera system 400 can be arranged as shown in FIG. 4 or in another manner.

The multiple sensor assemblies 405*a*, 405*b*, and 405*c* can be similar to the example sensor assembly 105 in FIGS. 1A and 1B, the example sensor assembly 135 in FIGS. 2A and 2B, the example sensor assembly 145 in FIGS. 3A and 3B, or they can include additional or different sensor assemblies.

The example sensor assemblies 405*a*, 405*b*, and 405*c* can include respective numbers of wireless sensor devices 110. The multiple sensor assemblies 405*a*, 405*b*, and 405*c* can be located at the same or different geographic regions and have the same or different fields of view. Each wireless sensor device 110 can be configured to process the RF signals from its field of view to identify additional parameters and transmit the parameters to the central computer system 415.

In some implementations, the sensor assemblies 405*a*, 405*b*, and 405*c* or the wireless sensor devices 110 are connected to the central computer system 415 through a network 408, for example, through one or more wireless or wireline communication links. In some implementations, some or all of the sensor assemblies 405*a*, 405*b*, and 405*c*, or the wireless sensor devices 110 themselves may be connected to the central computer system 415 directly.

The network 408 can include any type of data communication network. For example, the network 408 can include a wireless and/or a wired network, a Local Area Network (LAN), a Wide Area Network (WAN), a cellular network, a WiFi network, a network that includes a satellite link, a private network, a public network (such as the Internet), and/or another type of data communication network.

The central computer system 415 can be the same as the data processing system 115 in FIGS. 1A, 1B, 2A, 2B, 3A, and 3B, or it can be a different data processing system. The central computer system 415 can be configured to receive parameters from some or all of the wireless sensor devices 110 of the multiple sensor assemblies 405*a*, 405*b*, and 405*c*. The central computer system 415 can be configured to generate graphical representations of the fields of view of the sensor assemblies 405*a*, 405*b*, and 405*c*. In some implementations, the central computer system 415 can be configured to compile, aggregate, compare, analyze, or otherwise manipulate the parameters identified by some or all of the multiple sensor assemblies 405*a*, 405*b*, and 405*c*, and generate one or more graphical representations of a combined field of view of some or all of the multiple sensor assemblies 405*a*, 405*b*, and 405*c*. The central computer system 415 can be configured to perform additional or different operations based on the parameters or be configured to coordinate or control the operations of the multiple sensor assemblies 405*a*, 405*b*, and 405*c*. In some implementations, the multiple sensor assemblies 405*a*, 405*b*, and 405*c* can share the same data processing system (e.g., the central computer system 415) as shown in FIG. 4, or some or all of them may be attached to or integrated with a respective individual data processing system.

As shown in FIG. 4, the central computer system 415 includes a computer-readable medium 402 (e.g., a memory), a processor 404, and an interface 406. The central computer system 415 can include additional or different components and may be arranged in another different manner than that shown in FIG. 4.

The computer-readable medium 402 can include, for example, a random access memory (RAM), a storage device (e.g., a writable read-only memory (ROM) and/or others), a hard disk, and/or another type of storage medium. The central computer system 415 can be preprogrammed and/or it can be programmed (and reprogrammed) by loading a program from another source (e.g., from a CD-ROM, from another computer device through a data network, and/or in another manner).

The processor 404 may be or include one or more of a central processing unit (CPU), an application specific integrated circuit (ASIC), a field-programmable gate array (FPGA), or a combination of these and other suitable data processing apparatus. Generally, the processor 404 executes instructions and manipulates data to perform the operations of the RF camera system 400. Specifically, the processor 404 executes the functionality required to receive the parameters identified by the wireless sensor devices 110 of the multiple sensor assemblies 405*a*, 405*b*, and 405*c*, and generates graphical representations of the field of view based on the parameters.

The interface 406 can include a communication interface, an input/output devices interface, or other types of interfaces that couple internal components of the central computer system 415 and connect central computer system 415 with external apparatus. For example, the interface 406 can be a communication interface for communication with one or more networks 408, or the interface for coupling the user interface 425. The interface 406 can be configured to receive and transmit data in analog or digital form over communication link(s) such as a serial link, wireless link (e.g., infrared, radio frequency, and/or others), parallel link, and/or another type of link.

The user interface 425 can be the same as the example user interface 125 in FIGS. 1A, 1B, 2A, 2B, 3A, and 3B, or it can be a different user interface. For example, the user interface can be configured to display multiple graphical representations of the field of view associated with the multiple sensor assemblies 405*a*, 405*b*, and 405*c* simultaneously or sequentially. In some implementations, the user interface 425 can be configured to allow a user to compare, contrast, overlay, or otherwise manipulate the graphical representations of the fields of view associated with the multiple sensor assemblies 405*a*, 405*b*, and 405*c*. The user interface 425 can be configured to provide additional or different operations to manage the multiple the sensor assemblies 405*a*, 405*b*, and 405*c*.

Figure 5:
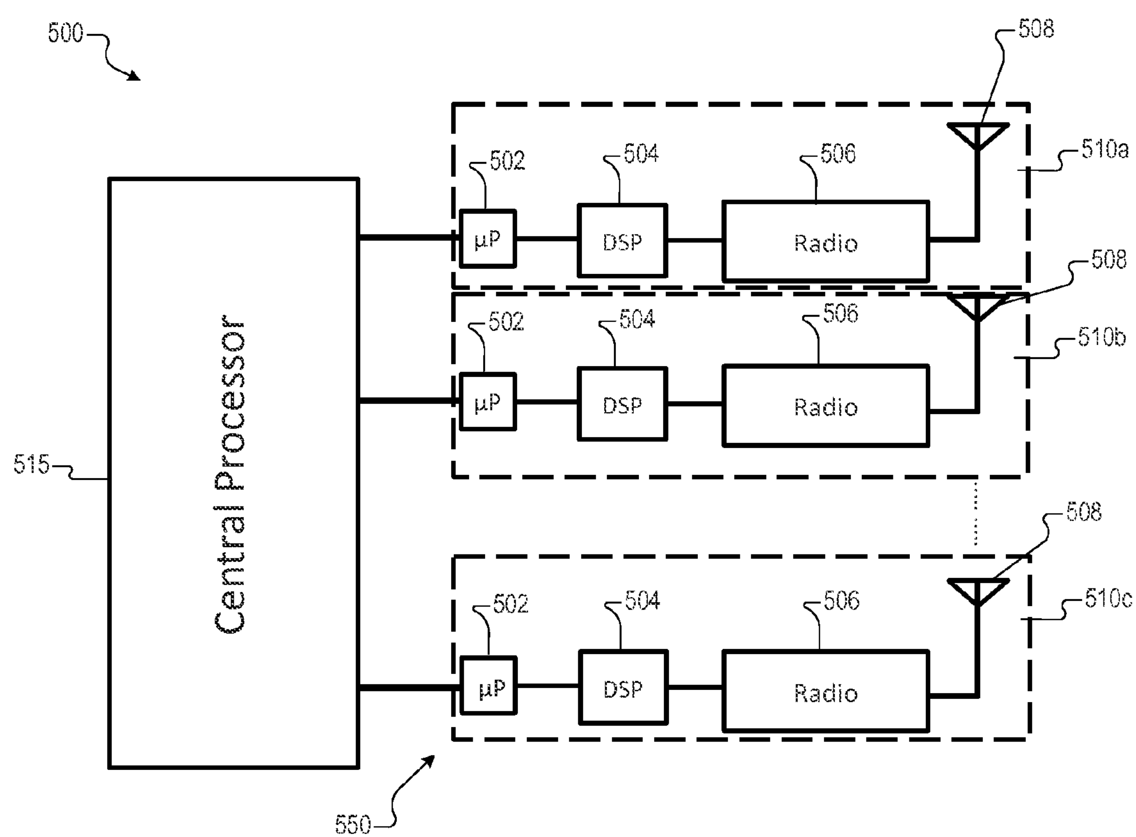
FIG. 5 is a block diagram showing example architecture for an RF camera system.

FIG. 5 is a block diagram showing example architecture 500 of an RF camera system 550. The example RF camera systems 100, 150, 200, 250, 300, 350, and 400 may be constructed according to the example architecture 500 of the RF camera system 550, or they can be constructed in a different manner. The example RF camera system 550 includes a central processor 515 and multiple RF sensor units 510*a*, 510*b*, and 510*c* (collectively 510). Each RF sensor unit 510 can correspond to a wireless sensor device 110. As shown in FIG. 5, each sensor unit 510 includes a respective microprocessor 502, radio 506, DSP 504, and antenna 508. A sensor unit can contain additional or different components. For example, a sensor unit can have more than one antenna and more than one radio path. Although FIG. 5 shows the multiple RF sensor units 510*a*, 510*b*, and 510*c* having the same configuration, in some implementations, the multiple sensor units 510 may be configured differently (e.g., have different antenna patterns, radio paths, types of microprocessors, etc.).

In the example architecture 500, each sensor unit 510 is independent of each other and the sensor units 510 operate in a distributive manner. In some alternative configurations, a single DSP is used to process signals from multiple radios, and the DSP is attached to a general processor. In such centralized architectures, the single DSP can be implemented as a general purpose FPGA that is relatively expensive and needs to operate a relatively high clocking speed to support all the sensor units.

Compared to the centralized architecture, the example distributive architecture 500 allows easy expansion, downsizing, and reconfiguration of the RF camera system 550, for example, by adding or removing sensor units 510 (e.g., wireless sensor devices 110), or otherwise modifying one or more sensor units 510 in the RF camera system 550. For example, the sensor units 510 can be portable, plug-and-play devices that can be relocated relatively easily and can operate in a variety of locations. In some implementations, a sensor unit can be a portable, modular device. For example, some sensor units 510 can be moveable or reconfigurable for use in multiple locations (e.g., in series), without having to substantially deconstruct or disassemble the RF camera system 550. In some cases, sensor units 510 are interchangeable with each other, so that the assembly of sensor units can be conveniently upgraded, expanded, tailored, or otherwise modified. The example distributive architecture 500 allows reconfiguration of the geometry and distribution density of the multiple sensor units 510 and, thus, permits a configurable field of view of the RF camera system 550.

In addition, each sensor unit 510 can be configured to look at different aspects (e.g., frequencies, frequency bands, amplitudes, phases, etc.) of the RF signals. As such, the example architecture 500 allows more flexibility in designing, upgrading, and customizing the RF camera system 550.

Furthermore, the example architecture 500 allows the sensor units 510 to work at relative low speeds and powers in some cases. As such, the RF camera system 550 can be of lower cost and power consumption. For example, the sensor units 510 (e.g., wireless sensor devices 110) can have standard communication interfaces (e.g., Ethernet, WiFi, USB, etc.) and accept standard power or operate on battery power. Accordingly, the configuration of the RF camera system 550 (e.g., the total number, density, and relative locations of the sensor units 510) can accommodate a variety of environments and can be modified or adjusted, for example, from time to time.

Figure 6:
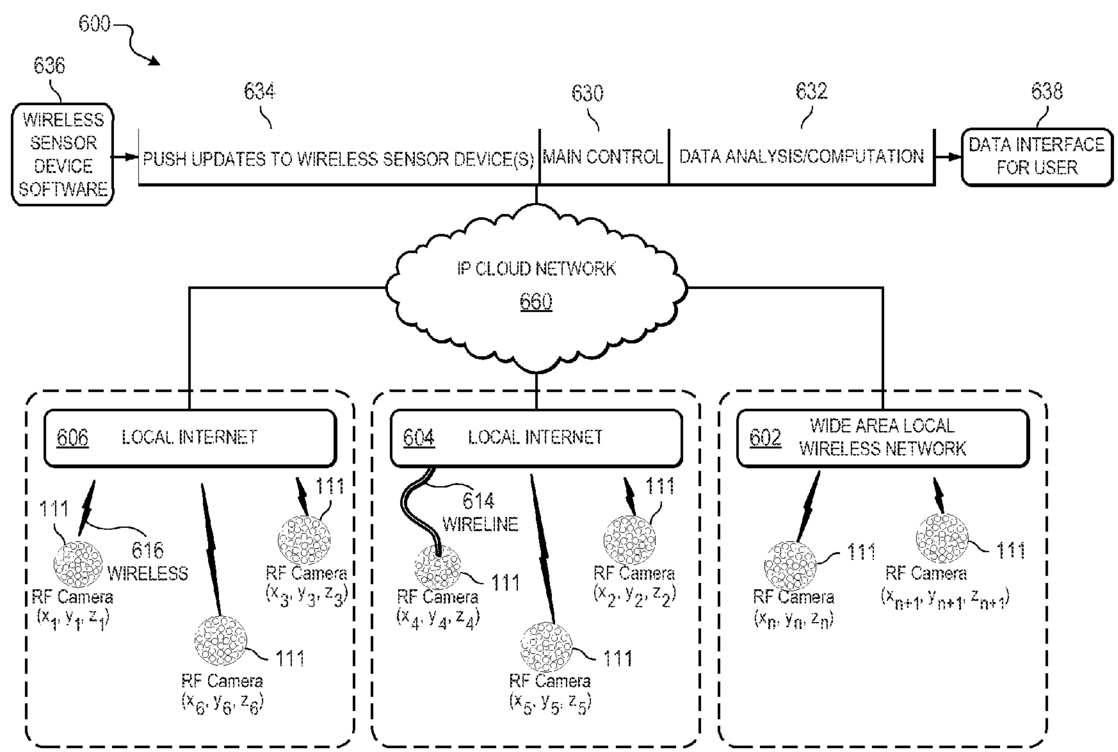
FIG. 6 is a block diagram showing an example system that includes multiple sensor assemblies.

FIG. 6 is a block diagram showing an example RF camera system 600. The RF camera system 600 can represent the RF camera system 400 of FIG. 4, or another RF camera system. The example RF camera system 600 includes a number of RF cameras 111, an IP cloud network 660, and a main controller 630. The RF cameras 111 may represent or include all or part of the RF camera systems 100, 150, 200, 250, 300, 350, and 400. For instance, the RF cameras 111 may represent or include only the sensor assemblies 105, 135, 145, and 405*a-c* in FIGS. 1A-4, respectively. The RF camera system 600 can include additional or different components, and the components and features of the RF camera system 600 can be arranged as shown in FIG. 6 or in another manner.

In the example shown in FIG. 6, each RF camera 111 resides at a respective physical location having spatial coordinates ($x_i$, $y_i$, $z_i$), where i varies from 1 to L (L is the number of the RF camera systems 111). The RF cameras 111 can include a number of wireless sensor devices (e.g., the wireless sensor devices 110). In some implementations, each RF camera 111 or its wireless sensor device can include a Global Positioning System (GPS) or another location identification system that identifies the location coordinates of the wireless sensor device, or the location coordinates can be identified in another manner. In some implementations, each RF camera 111 or its wireless sensor device has a unique identifier, and the identifier can be associated with a location identifier or location coordinates. In some implementations, each RF camera 111 or its wireless sensor device is associated with a descriptive location identifier. For instance, an RF camera can be assigned a location identifier that includes a physical address (e.g., street, city, zip code, etc.), a room identifier (e.g., office or suite number, room type such as "kitchen" or "reception") or another type of location identifier.

The example RF cameras 111 can be implemented as an assembly of wireless sensor devices. A set of wireless sensor devices or RF cameras 111 can be arranged in an ordered array or scattered randomly with known locations for each wireless sensor device or RF camera. The wireless sensor device inside the RF cameras 111 can monitor and analyze wireless-spectrum in both frequency and time domains and perform in-depth analyses of wireless communication services available at the associated geographic location. For instance, the wireless sensor device can detect an RF signal in a local wireless environment about the location of the wireless sensor device at any given time. For example, the wireless sensor device can detect an RF signal of a cellular network that provides coverage over the location of the wireless sensor device. In some cases, the wireless sensor devices passively interact with the cellular network, for example, without providing cellular service (e.g., to user equipment), without using the cellular network's radio resources, without supporting operation of the base stations, or without otherwise operating as a component of the cellular network. The wireless sensor devices can include specialized hardware (e.g., customized circuits, customized chipsets, etc.) and specialized software (e.g., signal processing and analysis algorithms) for detecting and analyzing wireless signals.

In some instances, the wireless sensor device can identify data packets and frames, extract synchronization information, cells and services identifiers, and quality measurements of RF channels (e.g., channel quality indicator (CQI)), and derive other parameters based on these and other control information and traffic data of the RF signal detected by the wireless sensor device. The control information and traffic data of the RF signal can include physical and medium access (MAC) layers information corresponding to a wireless communication standard such as 2G GSM/EDGE, 3G/CDMA/UMTS/TD-SCDMA, 4G/LTE/LTE-A, WiFi, Bluetooth, etc. The parameters of the RF signals (e.g., for particular frequencies or particular bandwidths, etc.) can include the amplitude, the power, or the signal-to-noise ratio (SNR) of detected RF signals, arrival-time data, the frequency at which detected RF signals have maximum power, or other parameters. In some implementations, the wireless sensor device can identify RF jammers and interferers, or other types of information.

In the example shown in FIG. 6, the RF cameras 111 are communicably linked to the IP cloud network 660 via one or more local networks (e.g., a local internet 606 or 604). In some implementations, the local networks are connected to the individual wireless sensor devices inside the RF cameras 111. The wireless sensor devices can be connected to the local network by a local wireline network 614 or a wireless network 616. The wireline network 614 can include, for example, Ethernet, xDSL (x-digital subscriber line), optical network, or other types of wireline communication networks. The wireless network 616 can include, for example, WiFi, Bluetooth, NFC, or other types of local wireless networks. In some implementations, some of the wireless sensor devices are connected directly to the IP cloud network 660 using one or more wide area networks 602. The wide area networks 602 can include, for example, cellular network, satellite network, or other types of wide area networks.

In the example shown, the data from the wireless sensor devices (e.g., parameters of the RF signals) are aggregated by a data aggregation or central control system (e.g., the main controller 630). In some implementations, data from the wireless sensor devices are aggregated by the RF cameras 111, and the RF cameras 111 send the aggregated data to the main controller 630, for example, through the IP network (e.g., the IP cloud network 660). In some implementations, data from the wireless sensor devices are aggregated by the main controller 630 by receiving the messages transmitted from the wireless sensor devices directly, for example, through wireless communications.

The example main controller 630 can be included in the data processing system 115 of FIGS. 1A, 1B, 2A, 2B, 3A, and 3B, the central computer system 415 of FIG. 4, the central processor 515 of FIG. 5, or another back-end system. The main controller 630 can be a computing system that includes one or more computing devices or systems. The main controller 630 or any of its components can be located at a data processing center, a computing facility, or another location. In the example shown, the main controller 630 can remotely control operation of the wireless sensor devices. Example functions of the main controller 630 can include aggregating the information from some or all of the wireless sensor devices of the RF cameras 111, upgrading the wireless sensor device software or the RF camera software, monitoring states of the wireless sensor devices and the RF cameras, etc. For example, the main controller 630 can include or be coupled to a software update module 634. In some cases, the software update module 634 can receive updates for the wireless sensor device software 636 and push the software updates to wireless sensor devices.

In the example shown in FIG. 6, the main controller 630 can put the wireless sensor devices into one or more calibration or test modes, reset various elements within the wireless sensor devices, or configure any individual wireless sensor device as necessary, for example, based on the location or state of the wireless sensor device, its neighboring wireless sensor devices, or other factors. In some examples, the states of a wireless sensor device can include: (i) the temperature of the wireless sensor device, (ii) the current power consumption of the wireless sensor device, (iii) the data rate flowing from the wireless sensor device back to the main controller 630, (iv) the signal strength, SSID's, or MAC addresses of the local WiFi signals around the wireless sensor device, (v) the location of the wireless sensor device (e.g., detected an internal GPS unit in the wireless sensor device), (vi) a signal (e.g., IP packets, control signaling transmitted over the network) that provides information on the state of the wireless sensor device or its surrounding wireless sensor devices. The main controller 630 may monitor additional or different states of the wireless sensor devices.

In some implementations, the main controller 630 can include or be coupled to a communication system that receives spectrum inspection information (e.g., parameters of the RF signals, states of the wireless sensor devices, etc.) transmitted from the wireless sensor devices. The main controller 630 can include or be coupled to a data analysis system 632 that can aggregate (e.g., assemble, compile, or otherwise manage) parameters of the RF signals transmitted from the multiple wireless sensor devices and generate a graphical representation of the field of view based on the parameters identified by the wireless sensor devices.

In some instances, the graphical representation can be presented on a data interface 638 to present users the usage, quality, or other information of the RF spectrum over the various locations of the wireless sensor devices. For example, the graphical representation can indicate detected amplitude, power, or phase information in each of the multiple bandwidths in an RF spectrum, for multiple wireless communication standards, or other information. The graphical representation can be presented with, for example, tables, charts, and graphs showing the parameters of the RF signals versus space and time. The graphical representation can include a graph or map showing the spatial distribution of wireless-spectrum in a geographic region. The graphical representation can include features indicating temporal distributions or trends of parameters of the RF signals (e.g., showing the peak, average, and valley traffic amount during a day, a month, or a year). The graphical representation can include features indicating the locations of wireless sources that transmitted wireless signals in the geographic region. The locations can be indicated as coordinates, plots, etc.

In some implementations, the data analysis system 632 can analyze real-time data, historical data, or a combination of both, and determine parameters of the RF signals for a geographic region. For example, the data analysis system 632 can determine a source location for the wireless signals received by the wireless sensor devices, and the generated graphical representation can include an indication of the source location.

Figure 7:
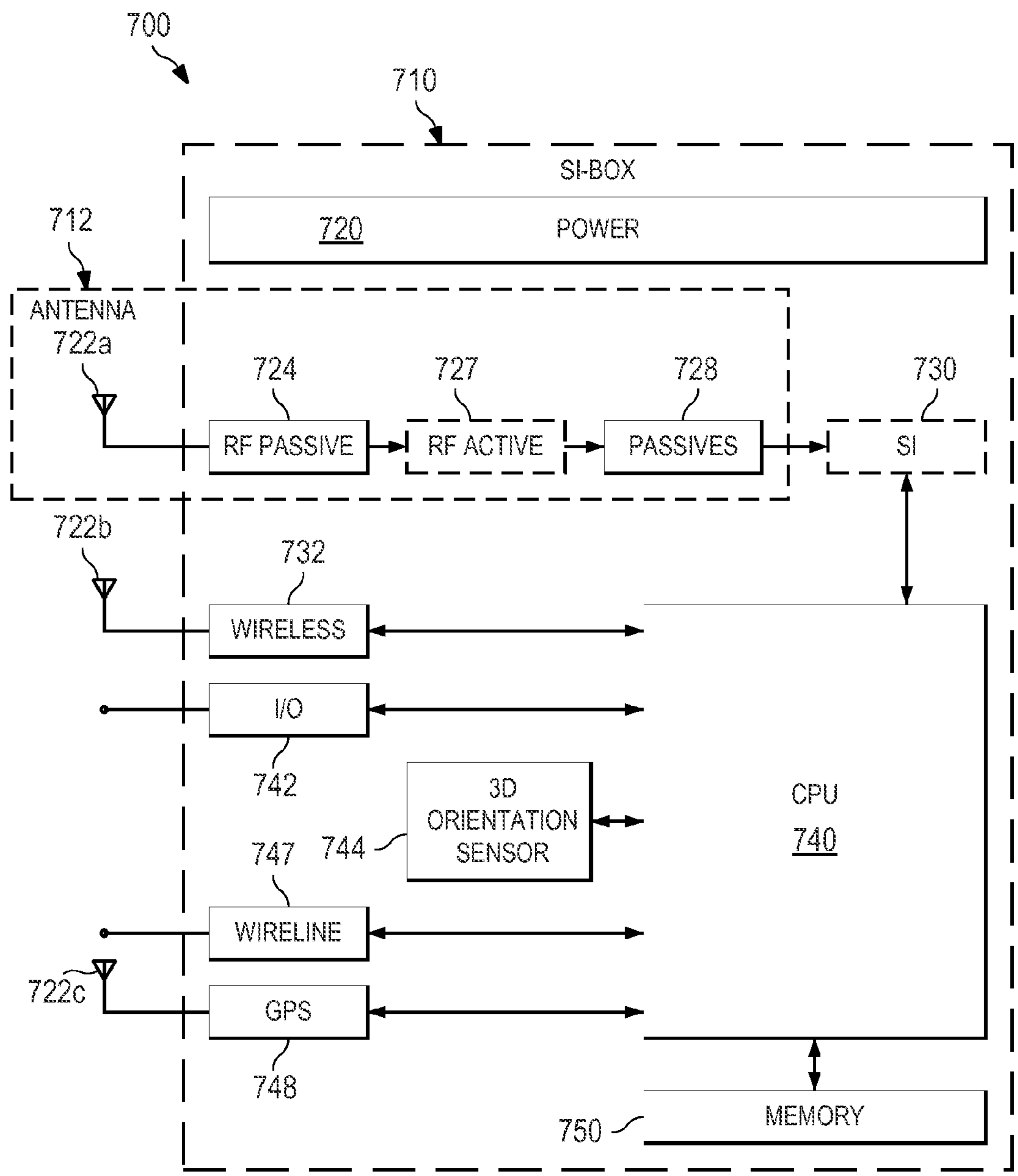
FIG. 7 is a block diagram showing an example wireless sensor device.

FIG. 7 is a block diagram showing an example wireless sensor device 700. In some cases, the wireless sensor devices 110 of FIGS. 1A-6 can be implemented as the example wireless sensor device 700 shown in FIG. 7 or as another type of wireless sensor device. The example wireless sensor device 700 includes a housing 710, an RF interface 712, a power management subsystem 720, a signal analysis subsystem (e.g., the SI subsystem 730, etc.), a CPU 740, a memory 750, communication interfaces, an input/output interface 742 (e.g., a USB connection), a GPS interface 748, and one or more sensors (e.g., 3D orientation sensors 744 such as a compass or gyroscope, temperature sensors, etc.). The wireless sensor device 700 can include additional or different components and features, and the features of the wireless sensor device can be arranged as shown in FIG. 7 or in another suitable configuration.

In some implementations, the housing 710 can be a portable housing that houses the RF interface 712, the power management subsystem 720, the signal analysis subsystem, the communication interfaces, and other components of the wireless sensor device 700. The housing can be made of plastic, metal, composites, or a combination of these and other materials. The housing can include components that are manufactured by molding, machining, extruding, or other types of processes. In some implementations, the wireless sensor device 700 can be coupled to or integrated with a support structure that supports an array of sensor devices. For example, the housing 710 of the wireless sensor device 700 can be attached to, incorporated into, or otherwise coupled to the support structure.

In some implementations, the design and arrangement of the housing 710 and components inside the housing 710 can be optimized or otherwise configured for monitoring and analyzing wireless signals. For example, the sizes, orientations, and relative locations of the components can be optimized for detecting and analyzing RF signals, and the device can be compact while accommodating all the necessary components.

In some implementations, the RF interface 712 is configured to detect RF signals in multiple bandwidths of an RF spectrum in a local wireless environment about the wireless sensor device 700. The RF interface 712 can include an antenna system and multiple radio paths that are configured to process RF signals in the respective bandwidths. In the example shown in FIG. 7, the RF interface 712 includes an antenna 722*a*, RF passive elements 724, RF active elements 727, and passive elements 728. The RF passive elements 724 can include, for example, matching elements, RF switches, and filters. The RF active elements 727 can include, for example, RF amplifiers. The passive elements 728 after the RF active elements 727 can include, for example, filters, matching elements, switches, and baluns.

In some examples, the signal analysis subsystem can be configured to identify the arrival-time data based on the RF signals and a synchronization signal. A signal analysis subsystem can include radio(s), digital signal processor (DSP), memory, and other components for extracting spectral parameters and for analyzing the RF spectrum. In some implementations, the combination of the RF interface 712 and the signal analysis subsystem can be referred to as a spectrum inspection (SI) signal path, which is described in greater detail with respect to FIG. 8.

The communication interfaces of the wireless sensor device 700 can be configured to transmit the parameters of the RF signals or other spectral-usage information to another system (e.g., the data processing system 115 of FIGS. 1A, 1B, 2A, 2B, 3A, and 3B, the central computer system 415 of FIG. 4, the central processor 515 of FIG. 5, or the main controller 630 of FIG. 6). The communication interfaces can include one or more wireless interfaces 732 (e.g., a WiFi connection, cellular connection, etc.), a wireline interface 747 to a local network (e.g., an Ethernet connection, xDSL connection, etc.), or other types of communication links or channels. The communication interfaces can share and reuse the common antennas (e.g., using an antenna array) or they can each have distinct and dedicated antennas.

The wireless interface 732 and the wireline interface 747 can each include a modem to communicate with the local or wide area network. For example, the wireless interface 732 and the wireline interface 747 can send SI information (e.g., the parameters of the RF signals) to a data processing system (e.g., the data processing system 115 of FIGS. 1A, 1B, 2A, 2B, 3A, and 3B, the central computer system 415 of FIG. 4, the central processor 515 of FIG. 5, or the main controller 630 of FIG. 6) and receive control information from the data processing system, via the local or wide area network. In some implementations, a wireless sensor device can be equipped with either or both of the communication interfaces. The wireline interface 747 can allow the example wireless sensor device 700 to exploit existing wireline communication infrastructure (e.g., in a building) and large transmission capacity of wireline communications (e.g., large bandwidth provided by optical network, advanced digital subscriber line technologies, etc.). The wireless interface 732 can enhance the mobility and flexibility of the example wireless sensor device 700 such that it can deliver SI information at a variety of locations and times, using Bluetooth, WiFi, cellular, satellite, or other wireless communication technologies.

In some implementations, the wireless interface 732 and the RF interface 712 can share hardware or software components (or both). In some implementations, the wireless interface 732 and the RF interface 712 can be implemented separately. In some implementations, the RF interface 712 is mainly responsible for signal reception rather than transmission, and the RF interface 712 can be implemented with specialized lower-power circuitry and, thus, reduce the overall power consumption of the wireless sensor device 700.

The power management subsystem 720 can include circuits and software for providing and managing power to the wireless sensor device 700. In some implementations, the power management subsystem 720 can include a battery interface and one or more batteries (e.g., rechargeable batteries, a smart battery with an embedded microprocessor, or a different type of internal power source). The battery interface may be coupled to a regulator, which may assist the battery in providing direct current electrical power to the wireless sensor device 700. As such, the wireless sensor device 700 can include a self-contained power supply and can be used at arbitrary locations without need for other external energy sources. Additionally or alternatively, the power management subsystem 720 can include an external power interface that receives power from an external source (e.g., an alternating current power source, an adapter, a converter, etc.). As such, the wireless sensor device 700 can be plugged into an external energy source.

In some implementations, the power management subsystem 720 can oversee and manage power consumption of the wireless sensor device 700. For example, the power management subsystem 720 can monitor the power consumption of the RF interface 712, communication interfaces, the CPU 740, and other components of the wireless sensor device 700, and report the power consumption state of the wireless sensor device 700, for example, to a central controller. In some implementations, the wireless sensor device 700 can be designed to have low power consumption, and the power management subsystem 720 can be configured to send an alert to the central controller or intervene with the operations of the wireless sensor device 700 if the power consumption exceeds a threshold. The power management subsystem 720 can include additional or different features.

The CPU 740 can include one or more processors or another type of data-processing apparatus that can execute instructions, for example, to manage the operations of the wireless sensor device 700. The CPU 740 may perform or manage one or more of the operations of a wireless sensor device described with respect to FIGS. 1A-6. In some implementations, the CPU 740 can be part of the SI subsystem 730. For example, the CPU 740 can process, compute, and otherwise analyze the measured wireless-spectrum data (e.g., from the RF interface 712). In some cases, the CPU 740 can execute or interpret software, scripts, programs, functions, executables, or other modules contained in the memory 750.

The input/output interface 742 can be coupled to input/output devices (e.g., a USB flash drive, a display, a keyboard, or other input/output devices). The input/output interface 742 can assist data transfer between the wireless sensor device 700 and the external storage or display device, for example, over communication links such as a serial link, a parallel link, a wireless link (e.g., infrared, radio frequency, or others), or another type of link.

The memory 750 can include, for example, a random access memory (RAM), a storage device (e.g., a writable read-only memory (ROM) or others), a hard disk, or another type of storage medium. The memory 750 can store instructions (e.g., computer code) associated with operations of the wireless sensor device 700, a main controller, and other components in an RF camera system. The memory 750 can also store application data and data objects that can be interpreted by one or more applications or virtual machines running on the wireless sensor device 700. The memory 750 can store, for example, location data, environment data, and state data of the wireless sensor device 700, wireless-spectrum data (e.g., parameters of the RF signals), and other data.

In some implementations, the wireless sensor device 700 can be programmed or updated (e.g., reprogrammed) by loading a program from another source (e.g., from a central controller through a data network, a CD-ROM, or another computer device in another manner). In some instances, the central controller pushes software updates to the wireless sensor device 700 as the updates become available, according to a predetermined schedule, or in another manner.

Figure 8:
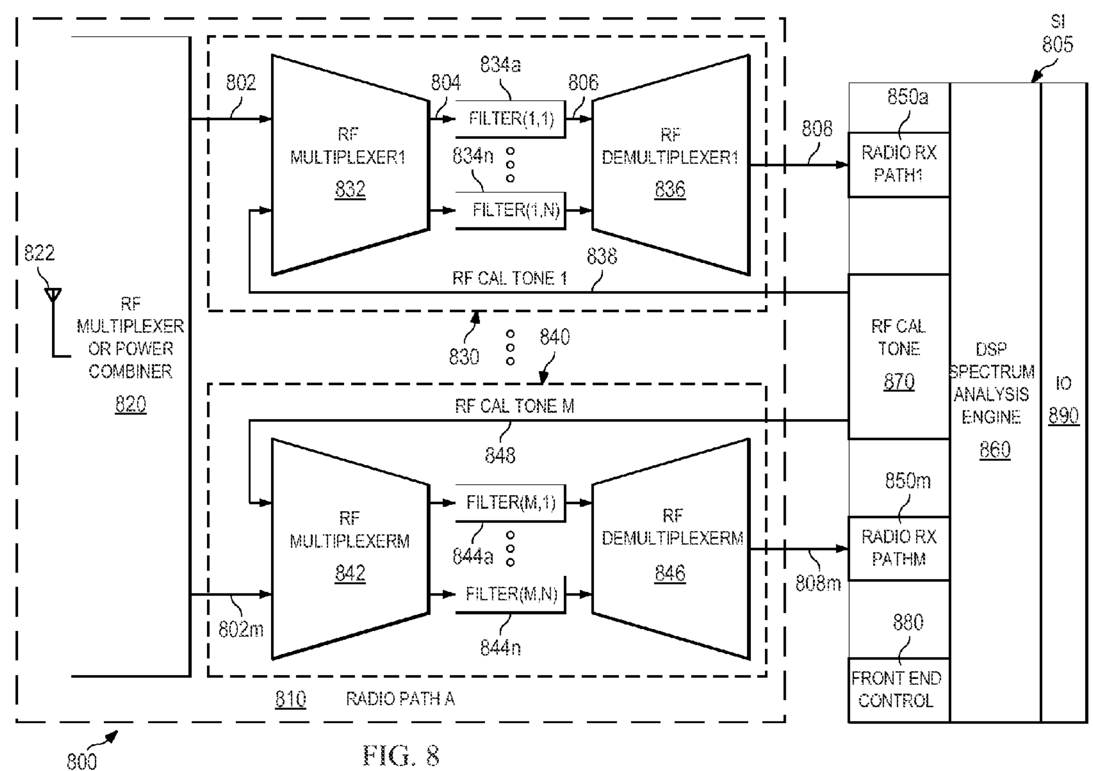
FIG. 8 is a block diagram showing an example spectrum inspection (SI) signal path of a wireless sensor device.

FIG. 8 is a block diagram showing an example spectrum inspection (SI) signal path 800. The SI signal path 800 includes an RF interface 810 (e.g., denoted as Radio Path A) and a spectrum analysis subsystem 805. The RF interface 712 of the wireless sensor device 700 of FIG. 7 can be implemented as the example RF interface 810 in FIG. 8 or in another manner. The SI subsystem 730 of the wireless sensor device 700 of FIG. 7 can be implemented as the example spectrum analysis subsystem 805 in FIG. 8 or in another manner. In some cases, the SI signal path 800 can perform all operations for monitoring and analyzing the wireless signals. For example, the SI signal path 800 can perform functions of a typical wireless receiver such as demodulation, equalization, channel decoding, etc. The SI signal path 800 can support signal reception of various wireless communication standards and access the spectrum analysis subsystem 805 for analyzing the wireless signals.

In the example shown, the RF interface 810 can be a wideband or narrowband front-end chipset for detecting and processing RF signals. For example, the RF interface 810 can be configured to detect RF signals in a wide spectrum of one or more frequency bands, or a narrow spectrum within a specific frequency band of a wireless communication standard. In some implementations, an SI signal path 800 can include one or more RF interfaces 810 to cover the spectrum of interest. Example implementations of such an SI signal path are described with respect to FIG. 9.

In the example shown in FIG. 8, the RF interface 810 includes one or more antennas 822, an RF multiplexer 820 or power combiner (e.g., an RF switch), and one or more signal processing paths (e.g., "path 1" 830, . . . , "path M" 840). The antenna 822 could be a multi-port antenna or single-port antenna. The antenna 822 can include an omnidirectional antenna, a directional antenna, or a combination of one or more of each. The example antenna 822 is connected to an RF multiplexer 820. In some implementations, the RF interface 810 can be configured to use the one or more antennas 822 for detecting the RF signals based on single-input single-output (SISO), single-input and multiple-output (SIMO), multiple-input and single-output (MISO), or multiple-input and multiple-output (MIMO) technologies.

In some implementations, an RF signal in the local environment of a wireless sensor device can be picked up by the antenna 822 and input into the RF multiplexer 820. Depending on the frequency of the RF signal that needs to be analyzed, the signal 802 output from the RF multiplexer 820 can be routed to one of the processing paths (i.e., "path 1" 830, . . . , "path M" 840). Here, M is an integer. Each path can include a distinct frequency band. For example, "path 1" 830 may be used for RF signals between 1 GHz and 1.5 GHz, while "path M" may be used for RF signals between 5 GHz and 6 GHz. The multiple processing paths may have a respective central frequency and bandwidth. The bandwidths of the multiple processing paths can be the same or different. The frequency bands of two adjacent processing paths can be overlapping or disjointed. In some implementations, the frequency bands of the processing paths can be allocated or otherwise configured based on the assigned frequency bands of different wireless communication standards (e.g., GSM, LTE, WiFi, etc.). For example, it can be configured such that each processing path is responsible for detecting RF signals of a particular wireless communication standard. As an example, "path 1" 830 may be used for detecting LTE signals, while the "path M" 840 may be used for detecting WiFi signals.

Each processing path (e.g., "processing path 1" 830, "processing path M" 840) can include one or more RF passive and RF active elements. For example, the processing path can include an RF multiplexer, one or more filters, an RF de-multiplexer, an RF amplifier, and other components. In some implementations, the signals 802, 802*m* output from the RF multiplexer 820 can be applied to a multiplexer in a processing path (e.g., "RF multiplexer 1" 832, . . . , "RF multiplexer M" 842). For example, if "processing path 1" 830 is selected as the processing path for the signal 802, the signal 802 can be fed into "RF multiplexer 1" 832. The RF multiplexer can choose between the signal 802 coming from the first RF multiplexer 820 or the RF calibration (cal) tone 838 provided by the spectrum analysis subsystem 805. The output signal 804 of "RF multiplexer 1" 832 can go to one of the filters, Filter(1,1) 834*a*, . . . , Filter (1,N) 834*n*, where N is an integer. The filters further divide the frequency band of the processing path into a narrower band of interest. For example, "Filter(1,1)" 834*a* can be applied to the signal 804 to produce a filtered signal 806, and the filtered signal 806 can be applied to "RF de-multiplexer 1" 836. In some instances, the signal 806 can be amplified in the RF de-multiplexer. The amplified signal 808 can then be input into the spectrum analysis subsystem 805.

Similarly, if "processing path M" 840 is selected as the processing path for the signal 802*m*, the signal 802*m* can be fed into "RF multiplexer M" 842. The RF multiplexer can choose between the signal 802*m* coming from the first RF multiplexer 820 or the RF calibration (cal) tone 848 provided by the spectrum analysis subsystem 805. The output signal of "RF multiplexer M" 842 can go to one of the filters, Filter(M,1) 844*a*, . . . , Filter (M,N) 844*n*, where N is an integer. In some instances, the output signal of the filters can be amplified in the RF de-multiplexer M 846. The amplified signal 808*m* can then be input into the spectrum analysis subsystem 805.

The spectrum analysis subsystem 805 can be configured to convert the detected RF signals into digital signals and perform digital signal processing to identify information based on the detected RF signals. The spectrum analysis subsystem 805 can include one or more SI radio receive (RX) paths (e.g., "SI radio RX path 1" 850*a*, "SI radio RX path M" 850*m*), a DSP spectrum analysis engine 860, an RF calibration (cal) tone generator 870, a front-end control module 880, and an I/O 890. The spectrum analysis subsystem 805 may include additional or different components and features.

In the example shown, the amplified signal 808 is input into "SI radio RX path 1" 850*a*, which down-converts the signal 808 into a baseband signal and applies gain. The down-converted signal can then be digitalized via an analog-to-digital converter. The digitized signal can be input into the DSP spectrum analysis engine 860. The DSP spectrum analysis engine 860 can, for example, identify packets and frames included in the digital signal, read preambles, headers, or other control information embedded in the digital signal (e.g., based on specifications of a wireless communication standard), determine the signal power and SNR of the signal at one or more frequencies or over a bandwidth, channel quality and capacity, traffic levels (e.g., data rate, retransmission rate, latency, packet drop rate, etc.), or other parameters. The output (e.g., the parameters) of the DSP spectrum analysis engine 860 can be applied and formatted to the I/O 890, for example, for transmission of the parameters to the data processing system via one or more communication interfaces of the wireless sensor device.

The RF calibration (cal) tone generator 880 can generate RF calibration (cal) tones for diagnosing and calibration of the radio RX paths (e.g., "radio RX path 1" 850*a*, . . . "radio RX path M" 850*m*). The radio RX paths can be calibrated, for example, for linearity and bandwidth.

Figure 9:
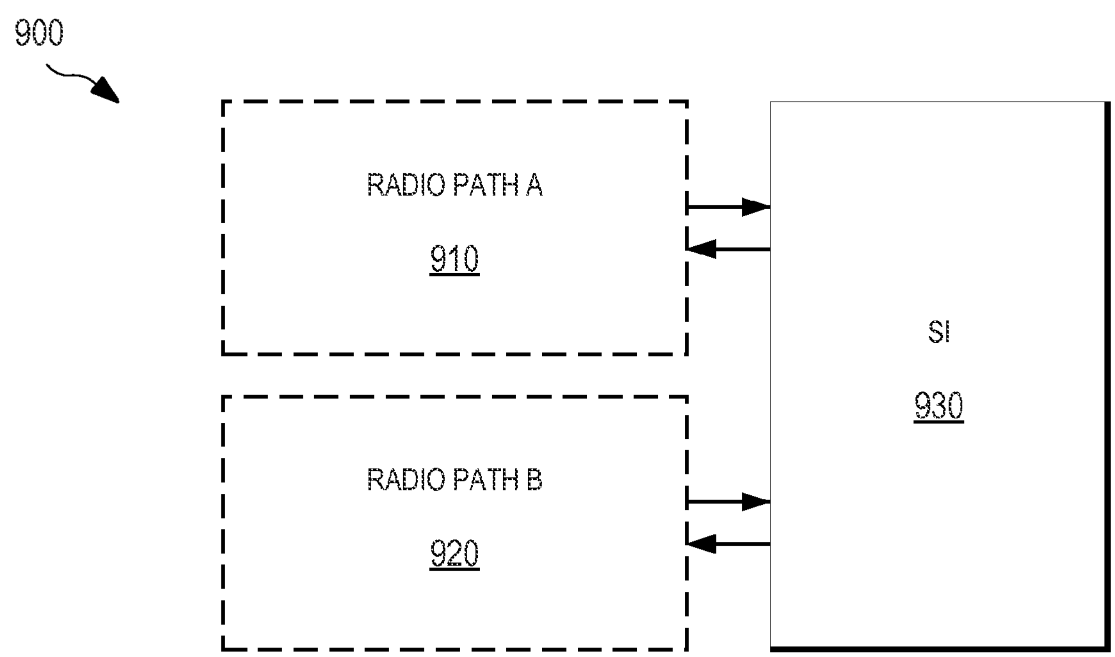
FIG. 9 is a block diagram showing another example SI signal path of a wireless sensor device.

FIG. 9 is a block diagram showing another example implementation of an SI signal path 900 of a wireless sensor device. In some instances, the SI signal path can include multiple RF interfaces (radio paths) that are connected to multiple different antennas. In the example shown in FIG. 9, the SI signal path 900 includes a radio path A 910 and a radio path B 920, each coupled to a spectrum analysis subsystem 930. The radio path A 910 and radio path B 920 can be configured in a similar manner as the RF interface or radio path A 810 of FIG. 8, or they can be configured in another manner. The radio path A 910 and radio path B 920 can have the same or different configuration, for example, covering the same or different frequency bands for wireless-spectrum monitoring and analysis.

Some of the operations described in this specification can be implemented as operations performed by a computer system, such as, for example, a computer system that includes one or more data processing apparatus that operates on data stored on one or more computer-readable storage devices or received from other sources. The term "data processing apparatus" encompasses all kinds of apparatus, devices, and machines for processing data, including by way of example a programmable processor, a computer, a system on a chip, or multiple ones, or combinations, of the foregoing. The apparatus can include special purpose logic circuitry, e.g., an FPGA (field programmable gate array) or an ASIC (application-specific integrated circuit). The apparatus can also include, in addition to hardware, code that creates an execution environment for the computer program in question, e.g., code that constitutes processor firmware, a protocol stack, a database management system, an operating system, a cross-platform runtime environment, a virtual machine, or a combination of one or more of them. The apparatus and execution environment can realize various different computing model infrastructures, such as web services, distributed computing and grid computing infrastructures.

A computer program (also known as a program, software, software application, script, or code) can be written in any form of programming language, including compiled or interpreted languages, declarative or procedural languages, and it can be deployed in any form, including as a stand-alone program or as a module, component, subroutine, object, or other unit suitable for use in a computing environment. A computer program may, but need not, correspond to a file in a file system. A program can be stored in a portion of a file that holds other programs or data (e.g., one or more scripts stored in a markup language document), in a single file dedicated to the program in question, or in multiple coordinated files (e.g., files that store one or more modules, sub-programs, or portions of code). A computer program can be deployed to be executed on one computing device or on multiple computers that are located at one site or distributed across multiple sites and interconnected by a communication network.

Some of the processes and logic flows described in this specification can be performed by one or more programmable processors executing one or more computer programs to perform actions by operating on input data and generating output. The processes and logic flows can also be performed by, and apparatus can also be implemented as, special purpose logic circuitry, e.g., an FPGA (field programmable gate array) or an ASIC (application-specific integrated circuit).

Processors suitable for the execution of a computer program include, by way of example, both general and special purpose microprocessors, and any one or more processors of any kind of digital computing device. Generally, a processor will receive instructions and data from a read-only memory or a random access memory or both. A computing device typically includes a processor for performing actions in accordance with instructions and one or more memory devices for storing instructions and data. Generally, a computing device will also include, or be operatively coupled to receive data from or transfer data to, or both, one or more storage devices for storing data. However, a computing device need not have such devices. Moreover, a computer can be embedded in another device, e.g., a mobile telephone, a personal digital assistant (PDA), a mobile audio or video player, a game console, a Global Positioning System (GPS) receiver, or a portable storage device (e.g., a universal serial bus (USB) flash drive), to name just a few. Devices suitable for storing computer program instructions and data include all forms of non-volatile memory, media and memory devices, including by way of example semiconductor memory devices, e.g., EPROM, EEPROM, and flash memory devices; magnetic disks, e.g., internal hard disks or removable disks; magneto-optical disks; and CD-ROM and DVD-ROM disks. The processor and the memory can be supplemented by, or incorporated in, special purpose logic circuitry.

To provide for interaction with a user, subject matter described in this specification can be implemented on a computer having a display device, e.g., an LCD (liquid crystal display) screen for displaying information to the user and a keyboard and a pointing device, e.g., touch screen, stylus, mouse, etc., by which the user can provide input to the computer. Other kinds of devices can be used to provide for interaction with a user as well; for example, feedback provided to the user can be any form of sensory feedback, e.g., visual feedback, auditory feedback, or tactile feedback; and input from the user can be received in any form, including acoustic, speech, or tactile input. In addition, a computing device can interact with a user by sending documents to and receiving documents from a device that is used by the user; for example, by sending web pages to a web browser on a user's client device in response to requests received from the web browser.

Some of the subject matter described in this specification can be implemented in a computing system that includes a back-end component, e.g., as a data server, or that includes a middleware component, e.g., an application server, or that includes a front-end component, e.g., a client computing device having a graphical user interface or a Web browser through which a user can interact with an implementation of the subject matter described in this specification, or any combination of one or more such back-end, middleware, or front-end components. The components of the system can be interconnected by any form or medium of digital data communication, e.g., a data network.

The computing system can include clients and servers. A client and server are generally remote from each other and typically interact through a data network. The relationship of client and server arises by virtue of computer programs running on the respective computers and having a client-server relationship to each other. In some implementations, a server transmits data to a client device. Data generated at the client device can be received from the client device at the server.

While this specification contains many details, these should not be construed as limitations on the scope of what may be claimed, but rather as descriptions of features specific to particular examples. Certain features that are described in this specification in the context of separate implementations can also be combined. Conversely, various features that are described in the context of a single implementation can also be implemented in multiple embodiments separately or in any suitable sub-combination.

A number of examples have been described. Nevertheless, it will be understood that various modifications can be made. Accordingly, other embodiments are within the scope of the following claims.

The invention claimed is:

1. A radio-frequency (RF) camera system comprising:

a sensor assembly unit comprising sensors supported at respective sensor locations, each sensor being supported at one of the sensor locations and comprising:

a radio subsystem configured to detect RF signals from a field of view defined by the sensor assembly unit; and a processor subsystem configured to process the RF signals detected by the radio subsystem to identify parameters of the RF signals, the parameters comprising phases of the RF signals; and a data processing system configured to:

receive the parameters identified by the sensors; and generate a graphical representation of the field of view based on the phases.

2. The RF camera system of claim 1, wherein the processor subsystem of each sensor is configured to identify amplitudes of the RF signals detected by the sensor, and the data processing system is configured to generate the graphical representation of the field of view based on the phases and amplitudes.

3. The RF camera system of claim 1, wherein the sensor assembly unit comprises a support structure that supports the sensors at their respective sensor locations, and the sensor locations define a planar sensor domain.

4. The RF camera system of claim 1, wherein the sensor locations define a three-dimensional sensor domain.

5. The RF camera system of claim 1, wherein each sensor is configured to monitor RF signals over time and to identify a time-series of parameters, and the data processing system is configured to generate a dynamic graphical representation of the field of view based on the time-series of parameters.

6. The RF camera system of claim 1, wherein the sensor assembly unit is configured to communicate the parameters to a data network, and the data processing system comprises a communication interface configured to receive the parameters from the data network.

7. The RF camera system of claim 1, further comprising a communication link that communicates the parameters between the sensor assembly unit and the data processing system independent of a data network.

8. The RF camera system of claim 1, further comprising an additional sensor assembly unit comprising additional sensors, each additional sensor configured to:

detect additional RF signals from a second field of view defined by the additional sensor assembly unit; and process the additional RF signals to identify additional parameters, wherein the data processing system is configured to generate a graphical representation of the second field of view based on the additional parameters.

9. A method of generating an image from radio-frequency (RF) signals, the method comprising:

detecting, by operation of sensors supported at respective sensor locations in a sensor assembly unit, RF signals from a field of view, the RF signals detected by radio subsystems of the respective sensors;

identifying parameters of the RF signals by processing the RF signals at the sensors that detected the respective RF signals, the parameters identified by processor subsystems of the respective sensors and comprising phases of the RF signals;

generating, by operation of a data processing system, a graphical representation of the field of view based on the phases identified by the sensors; and displaying, on a display device, an image comprising the graphical representation of the field of view.

10. The method of claim 9, comprising communicating the parameters from the sensor assembly unit to the data processing system without communicating the detected RF signals from the sensor assembly unit.

11. The method of claim 9, comprising communicating messages from the sensor assembly unit to the data processing system, wherein the messages include the parameters and an identifier associated with the sensor assembly unit.

12. The method of claim 9, wherein identifying parameters comprises identifying amplitudes of the RF signals detected by the sensors, and the graphical representation of the field of view is generated based on the phases and amplitudes.

13. The method of claim 9, comprising supporting the sensors at their respective sensor locations, wherein the sensor locations define a planar sensor domain.

14. The method of claim 9, comprising supporting the sensors at their respective sensor locations, wherein the sensor locations define a three-dimensional sensor domain.

15. The method of claim 9, comprising:

monitoring RF signals over time by operation of the sensors;

identifying a time-series of the parameters based on the RF signals by operation of the sensors; and generating a dynamic graphical representation of the field of view based on the time-series of parameters.

16. A method comprising:

receiving, at a computing system, parameters of RF signals detected by sensors in a sensor assembly unit, the sensors supported at respective locations in the sensor assembly unit and defining a field of view, the parameters comprising phases of the RF signals identified by processing each of the RF signals at the respective sensor that detected the RF signal, the sensors each comprising a radio subsystem to detect the RF signals and a processor subsystem to identify the parameters; and generating, by operation of the computing system, a graphical representation of the field of view based on the phases.

17. The method of claim 16, wherein the parameters comprise a first set of parameters, the sensors comprise a first set of sensors, the sensor assembly unit comprises a first sensor assembly unit, the field of view comprises a first field of view, and the method further comprises:

receiving, at the computing system, a second set of parameters of RF signals detected by a second set of sensors in a second sensor assembly unit, the second set of sensors supported at respective locations in the second sensor assembly unit and defining a second field of view, the second set of parameters identified by processing each of the RF signals at the respective sensor that detected the RF signal; and generating, by operation of the computing system, a graphical representation of the second field of view based on the parameters.

18. The method of claim 16, wherein the parameters further comprise amplitudes of the RF signals, and the graphical representation is generated based on the phases and the amplitudes.

19. The RF camera system of claim 1, wherein the sensor locations form an ordered array that defines a sensor domain, and the field of view extends over a region projected from the sensor domain.

20. The RF camera system of claim 19, wherein the sensor locations form an ordered rectangular array that defines a planar sensor domain, and the field of view projects from the planar sensor domain in a direction that is perpendicular to the planar sensor domain.

21. The method of claim 9, further comprising adjusting the sensors at their respective sensor locations in the sensor assembly unit to define the field of view.

22. The RF camera system of claim 1, wherein the radio subsystem of each sensor comprises a radio path, and the processor subsystem of each sensor comprises a digital signal processor (DSP).

23. The RF camera system of claim 22, wherein the radio subsystem of each sensor comprises multiple radio paths.

24. The RF camera system of claim 1, wherein the radio subsystem of each sensor comprises a radio frequency (RF) interface, and the processor subsystem of each sensor comprises a spectrum analysis subsystem.

25. The RF camera system of claim 24, wherein the radio subsystem of each sensor comprises multiple radio frequency (RF) interfaces.

26. The RF camera system of claim 24, wherein the radio subsystem comprises multiple processing paths, each processing path configured to process a distinct frequency band.

27. The RF camera system of claim 26, wherein each processing path is configured to process signals of a particular wireless communication standard.

28. The RF camera system of claim 26, wherein each processing path comprises a multiplexer, a filter, and a de-multiplexer.

29. The RF camera system of claim 1, wherein the radio subsystem is configured to detect RF signals in multiple frequency bandwidths of an RF spectrum, and the processor subsystem is configured to process the RF signals in the multiple frequency bandwidths.

* * * * *